(12) United States Patent
Yamada et al.

(10) Patent No.: US 12,114,520 B2
(45) Date of Patent: Oct. 8, 2024

(54) ORGANIC LIGHT EMITTING DEVICE, AND DISPLAY APPARATUS, PHOTOELECTRIC CONVERSION APPARATUS, ELECTRONIC APPARATUS, ILLUMINATION APPARATUS, AND MOVING OBJECT INCLUDING THE SAME

(71) Applicant: CANON KABUSHIKI KAISHA, Tokyo (JP)

(72) Inventors: Naoki Yamada, Inagi (JP); Satoru Shiobara, Hiratsuka (JP); Jun Kamatani, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 535 days.

(21) Appl. No.: 16/862,317

(22) Filed: Apr. 29, 2020

(65) Prior Publication Data

US 2020/0358021 A1   Nov. 12, 2020

(30) Foreign Application Priority Data

May 7, 2019   (JP) .................................. 2019-087712

(51) Int. Cl.
*H10K 50/16* (2023.01)
*H01L 27/146* (2006.01)
(Continued)

(52) U.S. Cl.
CPC ....... *H10K 50/16* (2023.02); *H01L 27/14627* (2013.01); *H10K 50/11* (2023.02); *H10K 50/166* (2023.02); *H10K 50/818* (2023.02); *H10K 59/1213* (2023.02); *H10K 59/65* (2023.02); *H10K 85/657* (2023.02);
(Continued)

(58) Field of Classification Search
CPC .. H01L 51/0085; H01L 51/0072; H01L 51/00
See application file for complete search history.

(56) References Cited

U.S. PATENT DOCUMENTS

| | | | | |
|---|---|---|---|---|
| 2009/0066227 A1* | 3/2009 | Okinaka | ............. | H10K 85/633 313/504 |
| 2013/0228753 A1* | 9/2013 | Moon | .................. | H10K 85/654 257/E51.026 |

(Continued)

FOREIGN PATENT DOCUMENTS

| | | |
|---|---|---|
| CN | 102683604 A | 9/2012 |
| CN | 106164215 A | 11/2016 |

(Continued)

OTHER PUBLICATIONS

Schmitz Christoph, et al., "Lithium-Quinolate Complexes as Emitter and Interface Materials in Organic Light-Emitting Diodes", Chem. Mater. , Sep. 29, 2020 , 2000, 12 , 3012-3019.

*Primary Examiner* — Younes Boulghassoul
*Assistant Examiner* — Quinton A Brasfield
(74) *Attorney, Agent, or Firm* — Canon U.S.A., Inc. I.P. Division

(57) ABSTRACT

An organic light emitting device including, in sequence, an anode, a light emitting layer, a first electron transport layer, a second electron transport layer, and a cathode, wherein the second electron transport layer includes a first material and a second material different from the first material, and the first electron transport layer includes a third material and a fourth material different from the third material.

25 Claims, 6 Drawing Sheets

(51) Int. Cl.
   *H10K 50/11* (2023.01)
   *H10K 50/818* (2023.01)
   *H10K 59/121* (2023.01)
   *H10K 59/65* (2023.01)
   *H10K 85/60* (2023.01)
   *H10K 101/40* (2023.01)

(52) U.S. Cl.
   CPC ......... *H10K 85/615* (2023.02); *H10K 85/622* (2023.02); *H10K 85/626* (2023.02); *H10K 85/654* (2023.02); *H10K 85/6572* (2023.02); *H10K 2101/40* (2023.02)

(56) References Cited

U.S. PATENT DOCUMENTS

2016/0359117 A1* 12/2016 Hamade ............... H10K 85/657
2017/0271609 A1* 9/2017 Imai ....................... H10K 50/00
2019/0198796 A1* 6/2019 Kim ....................... H10K 50/15

FOREIGN PATENT DOCUMENTS

| | | |
|---|---|---|
| CN | 106252527 A | 12/2016 |
| CN | 107579159 A | 1/2018 |
| JP | 2002-313583 A | 10/2002 |
| JP | 2005-353526 A | 12/2005 |
| JP | 2007-036175 A | 2/2007 |
| JP | 2009-503849 A | 1/2009 |
| JP | 2013157552 A | 8/2013 |
| JP | 2015-005552 A | 1/2015 |
| JP | 2017510071 A | 4/2017 |
| JP | 2017510074 A | 4/2017 |
| JP | 2018120846 A | 8/2018 |
| JP | 2020184569 A | 11/2020 |

* cited by examiner

ORGANIC LIGHT EMITTING DEVICE, AND DISPLAY APPARATUS, PHOTOELECTRIC CONVERSION APPARATUS, ELECTRONIC APPARATUS, ILLUMINATION APPARATUS, AND MOVING OBJECT INCLUDING THE SAME

BACKGROUND OF THE INVENTION

Field of the Invention

The present disclosure relates to an organic light emitting device, and a display apparatus, a photoelectric conversion apparatus, an electronic apparatus, an illumination apparatus, and a moving object that include the organic light emitting device.

Description of the Related Art

The organic light emitting device is a device including a first electrode, a second electrode, and a light emitting layer disposed between these electrodes. Injection of carriers from these electrodes causes generation of excitons in the light emitting layer. The excitons return to the ground state while releasing energy as light emission. In recent years, research and development has been underway for apparatuses including organic light emitting devices, such as display apparatuses, electronic apparatuses, and illumination apparatuses. In order to improve the performance of these apparatuses, intensive research and development is carried out for providing an organic light emitting device driven at a lower voltage and having a longer longevity.

PCT Japanese Translation Patent Publication No. 2009-503849 (hereinafter PTL 1) describes an OLED device including a light emitting layer, a hole blocking layer, and an electron transport layer. According to PTL 1, in order to reduce the drive voltage with the color purity being maintained, the electron transport layer is formed as a mixture layer of a plurality of compounds.

PTL 1 states that, in the OLED device, the electron transport layer is formed as a mixture layer of a plurality of compounds. However, a hole blocking layer disposed between the light emitting layer and the cathode is constituted by a single compound, so that there has been room for improvement in reduction in the drive voltage.

SUMMARY OF THE INVENTION

The present disclosure provides an organic light emitting device having a reduced drive voltage.

An embodiment of the present disclosure provides an organic light emitting device including, in sequence, an anode, a light emitting layer, a first electron transport layer, a second electron transport layer, and a cathode, wherein the second electron transport layer includes a first material and a second material different from the first material, and the first electron transport layer includes a third material and a fourth material different from the third material.

Further features of the present disclosure will become apparent from the following description of exemplary embodiments with reference to the attached drawings.

DESCRIPTION OF THE EMBODIMENTS

An embodiment of the present disclosure provides an organic light emitting device including, in sequence, an anode, a light emitting layer, a first electron transport layer, a second electron transport layer, and a cathode, wherein the second electron transport layer includes a first material and a second material different from the first material, the first electron transport layer includes a third material and a fourth material different from the third material.

The first electron transport layer and the second electron transport layer are each a mixture layer including a plurality of materials, to thereby achieve a reduction in the drive voltage of the organic light emitting device.

When the light emitting layer and the first electron transport layer are disposed in contact with each other, the first electron transport layer and the second electron transport layer are disposed in contact with each other, and the light emitting layer includes a fifth material, the fifth material and the fourth material can be the same compound, and the second material and the third material can be the same compound. In such a case, adjacent organic compound layers include the same materials in common, which results in a reduction in the interlayer energy barrier, and contribution to a reduction in the drive voltage.

The light emitting layer may include the fifth material and a sixth material. Relative to 100 wt % of the weight of the light emitting layer, the fifth material may be a compound having a larger weight percentage than the sixth material in the light emitting layer. The sixth material may be a light emitting material. The light emitting material will be described later.

Figure 1:
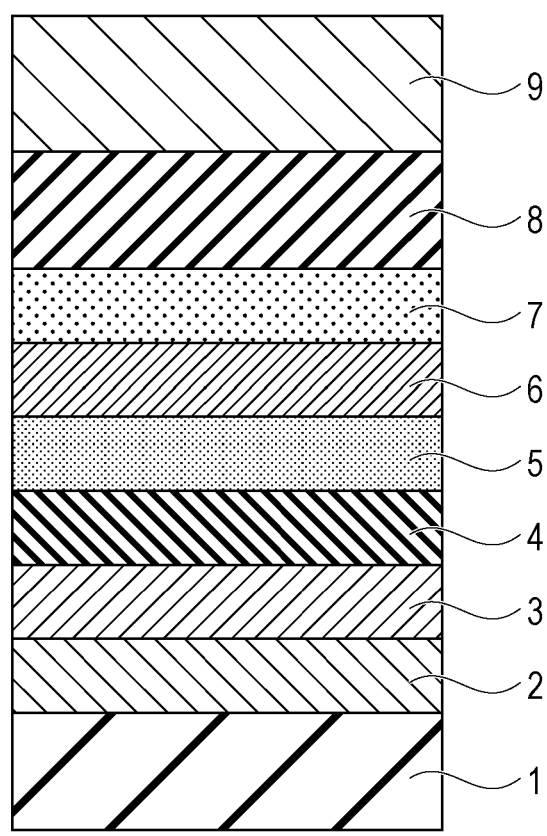
FIG. 1 is a schematic sectional view illustrating an example of an organic light emitting device according to an embodiment of the present disclosure.

Hereinafter, an embodiment of the present disclosure will be described further in detail with reference to FIG. 1. FIG. 1 is a schematic sectional view of an embodiment of the present disclosure.

Referring to FIG. 1, the organic light emitting device includes a stack of, on an insulating layer 1, in sequence, an anode 2, a hole transport layer 3, an electron blocking layer 4, a light emitting layer 5, a first electron transport layer 6, a second electron transport layer 7, an electron injection layer 8, and a cathode 9. The light emitting layer 5, the first electron transport layer 6, and the second electron transport layer 7 are stacked as adjacent layers. The light emitting layer 5 may be constituted by a plurality of layers, and may include another functional layer between the plurality of light emitting layers. FIG. 1 merely illustrates a representative configuration. This configuration may further optionally include, for example, a hole injection layer, a hole transport layer, an electron transport layer, and an electron injection layer, or may not include such organic compound layers.

Figure 2:
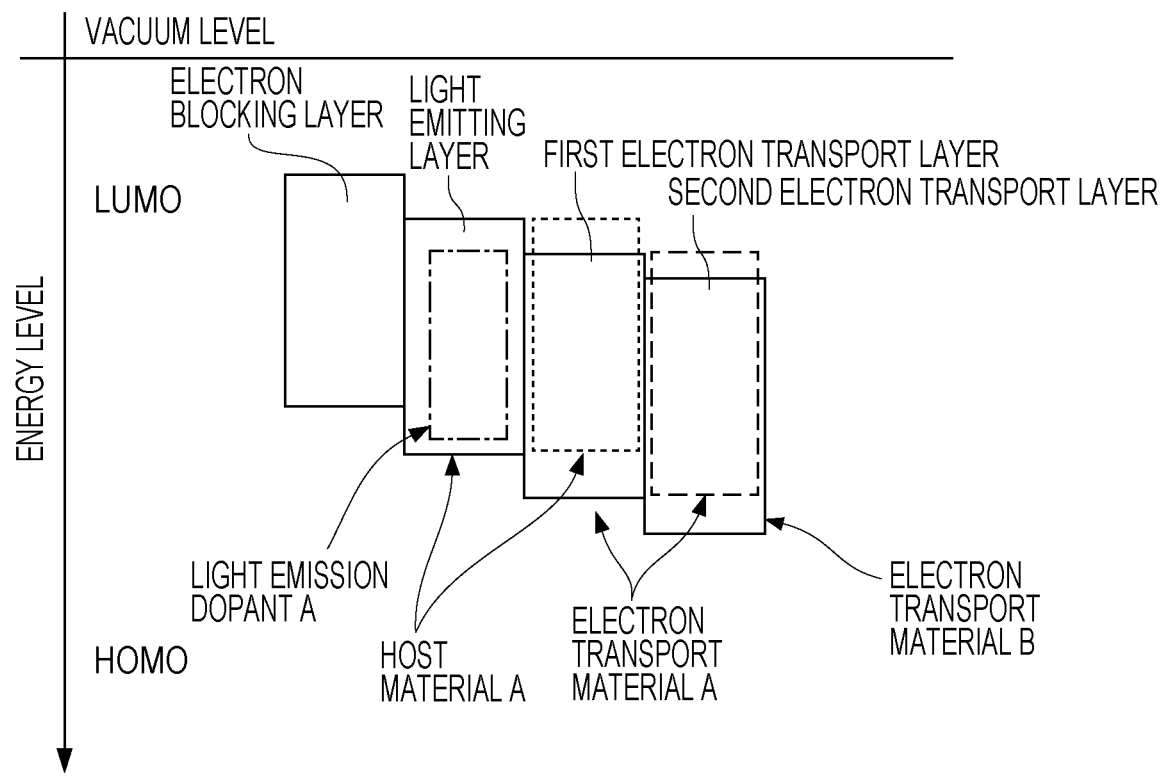
FIG. 2 is a schematic energy diagram of the energy levels of a light emitting layer and adjacent layers constituting an organic light emitting device according to an embodiment of the present disclosure.

FIG. 2 is a schematic energy diagram illustrating an example of the energy levels of the electron blocking layer, the light emitting layer, the first electron transport layer, and the second electron transport layer constituting an organic light emitting device according to an embodiment of the present disclosure.

Incidentally, the highest occupied molecular orbital (HOMO) energy and the lowest unoccupied molecular orbital (LUMO) energy are determined relative to the vacuum level. Ordinary molecules have negative values for HOMO energy and LUMO energy. In this Specification, HOMO energy and LUMO energy are described using absolute values, specifically using positive values. HOMO stands for Highest Occupied Molecular Orbital. LUMO stands for Lowest Unoccupied Molecular Orbital.

In this embodiment, the first material is an electron transport material B; the second material is an electron transport material A; the third material is the electron transport material A; the fourth material is a host material A; the fifth material is the host material A; and the sixth material is a light emission dopant A.

In the organic light emitting device according to this embodiment, the first electron transport layer and the second electron transport layer are each a mixture layer including a plurality of materials, to thereby achieve a reduction in the drive voltage. In addition, the effect of reducing the drive voltage can be made stronger by employing the following feature.

(1) In this embodiment, among the light emitting layer, the first electron transport layer, and the second electron transport layer, adjacent layers have the same materials in common. In this case, as illustrated in FIG. 2, the second electron transport layer includes the electron transport material A and the electron transport material B, and the first electron transport layer includes the electron transport material A and the host material A, to thereby reduce the energy barrier for injection of electrons from the cathode side to the light emitting layer. Mixing of the materials inferentially causes interaction between the materials to generate an energy level at an intermediate level between the levels of these materials, which results in a reduction in the injection barrier.

In this embodiment, the first electron transport layer and the second electron transport layer are each a mixture layer including a plurality of materials. When two electron transport layers are formed such that one of them is a mixture layer, the injection barrier is not sufficiently reduced and the drive voltage increases. By contrast, when two electron transport layers are formed such that both of them are mixture layers, the injection barrier can be considerably reduced.

When a single mixture layer alone is formed and a host material is included in the mixture layer, holes are injected from the light emitting layer to the mixture layer, further to the electron injection layer, and even to the cathode. In this case, the light emission efficiency considerably decreases.

The device can have a configuration that satisfies, in addition to the feature (1), the following conditions:

(2) The electron transport material A and the host material A are constituted by compounds composed of hydrocarbons alone;

(3) The electron transport material B is constituted by a compound including a nitrogen-containing aromatic;

(4) The following relation is satisfied:
Absolute value of HOMO energy: (Electron transport material A)<(Electron transport material B); and (5) The following relation is satisfied:
Absolute value of HOMO energy: (Host material A)< (Electron transport material A).

Hereinafter, these features will be described.

(2) In this embodiment, the electron transport material A and the host material A are constituted by materials composed of hydrocarbons alone. The compounds used as the electron transport material A and the host material A are not particularly limited, but can be compounds not having bonds having low bonding stability within the molecular structures. The compounds can have structures not including nitrogen-containing aromatics in the molecules. In other words, the electron transport material A and the host material A can be compounds composed of hydrocarbons alone.

The reason for this is as follows. When a compound having, within the molecular structure, a bond having low bonding stability, in other words, a compound having an unstable bond having a low bond energy such as an amino group is included as the host of the light emitting layer constituting an organic light emitting device, the compound tends to undergo driving deterioration during driving of the device. Thus, the organic light emitting device tends to have a shorter longevity.

For example, in the following compounds A-1, A-2, and B-1, bonds having low bonding stability are the bond between a carbazole ring and a phenylene group and the bond (nitrogen-carbon bond) between an amino group and a phenyl group. Referring to compound B-1, the carbon-carbon bond has higher bonding stability. Incidentally, the calculation was performed using b3-lyp/def2-SV(P).

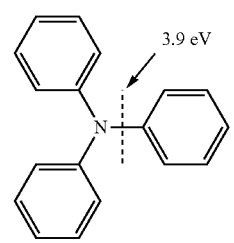

A-1

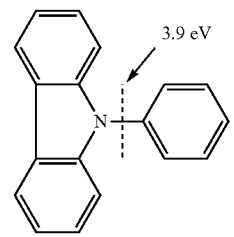

A-2

B-1

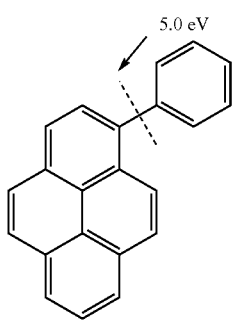

5.0 eV

Incidentally, molecular orbital method calculation was performed using, the currently widely used program, Gaussian 09 (Gaussian 09, Revision C. 01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford CT, 2010.).

Compounds having, within molecules, nitrogen-containing aromatics such as compounds A-1 and A-2 are not stable against oxidation, and hence desirably do not receive holes. On the other hand, the light emitting layer and the first electron transport layer according to this embodiment are organic compound layers to which holes tend to be injected. Thus, for the light emitting layer host material and the first electron transport layer, structures without nitrogen-containing aromatics, namely, hydrocarbon compounds can be used.

Thus, the first material and the second material in an organic light emitting device according to an embodiment of the present disclosure can be constituted by compounds composed of hydrocarbons alone. Stated another way, the compound included in common in the host material of the light emitting layer and the first electron transport layer, and the compound included in common in the first electron transport layer and the second electron transport layer can be compounds composed of hydrocarbons alone.

More specifically, such a compound composed of a hydrocarbon alone may have an aryl group. The aryl group may have, as a substituent, an alkyl group having 1 to 12 carbon atoms. The aryl group can be selected from benzene, naphthalene, fluorene, benzofluorene, phenanthrene, chrysene, triphenylene, pyrene, fluoranthene, and benzofluoranthene. In other words, the aryl group can have a molecular structure constituted by an aromatic hydrocarbon in which the number of benzene rings linearly condensed is not more than two. This is because such compounds have higher stability than compounds including rings constituted by three or more benzene rings linearly condensed, such as anthracene and tetracene.

Specific examples of the alkyl group having 1 to 12 carbon atoms that may be included in the aryl group include a methyl group, an ethyl group, an n-propyl group, an iso-propyl group, an n-butyl group, an iso-butyl group, a sec-butyl group, a tert-butyl group, an n-pentyl group, an iso-pentyl group, a neo-pentyl group, a tert-pentyl group, a hexyl group, a heptyl group, and an octyl group.

(3) The electron transport material B is constituted by a heterocyclic compound.

Since the electron transport material B is included in the layer into which electrons are injected from the cathode, it can be a material that tends to undergo injection of electrons. The electron transport material B can be a material that promotes injection of electrons as a result of interaction with an alkali metal compound used for the electron injection layer, such as aluminum-lithium or lithium fluoride. Thus, the electron transport material B can be a heterocyclic compound: in particular, preferred are heterocyclic compounds having a nitrogen atom as a heteroatom. Interaction between the nitrogen atom of such a heterocyclic compound and the alkali metal promotes injection of electrons, to thereby achieve a reduction in the drive voltage.

(4) The following relation is satisfied:

Absolute value of HOMO energy: (Electron transport material A)<(Electron transport material B).

This relation means that the absolute value of HOMO energy of the electron transport material A is smaller than the absolute value of HOMO energy of the electron transport material B. When this relation is satisfied, these two layers of electron transport layers are disposed in ascending order of the absolute value of the HOMO energy from the light emitting layer side. These electron transport layers also have a hole blocking function, to thereby reduce the flow of holes from the light emitting layer to the cathode side. More specifically, the electron transport material B reduces flow of holes from the first electron transport layer to the second electron transport layer. This effect reduces leakage of holes from the light emitting layer, to increase the light emission efficiency. Deterioration of the electron transport layers due to leakage of holes to the electron transport layers is reduced to thereby increase the longevity.

In particular, when the electron transport material B is a nitrogen-containing aromatic compound, it tends to deteriorate due to injection of holes. Thus, holes can be blocked by the electron transport material A.

(5) The following relation is satisfied:

Absolute value of HOMO energy: (Host material A)< (Electron transport material A).

When this relation is satisfied, the electron transport material A reduces the flow of holes from the light emitting layer to the first electron transport layer, in other words, reduces the flow of holes from the light emitting layer to the cathode side.

This effect reduces leakage of holes from the light emitting layer, to increase the light emission efficiency. Deterioration of electron transport layers due to leakage of holes to the electron transport layers is reduced to thereby increase the longevity.

Hereinafter, specific examples of electron transport materials used in the present disclosure will be described. The electron transport materials can be freely selected from materials that can transport electrons injected from the cathode to the light emitting layer. The electron transport materials are selected, for example, in balance with the hole mobility of the hole transport material. Examples of the material having electron transport performance include oxadiazole derivatives, oxazole derivatives, pyrazine derivatives, triazole derivatives, triazine derivatives, quinoline derivatives, quinoxaline derivatives, phenanthroline derivatives, organoaluminum complexes, and condensed ring compounds (such as fluorene derivatives, naphthalene derivatives, chrysene derivatives, and anthracene derivatives).

The following are non-limiting specific examples of compounds used as the electron transport materials.

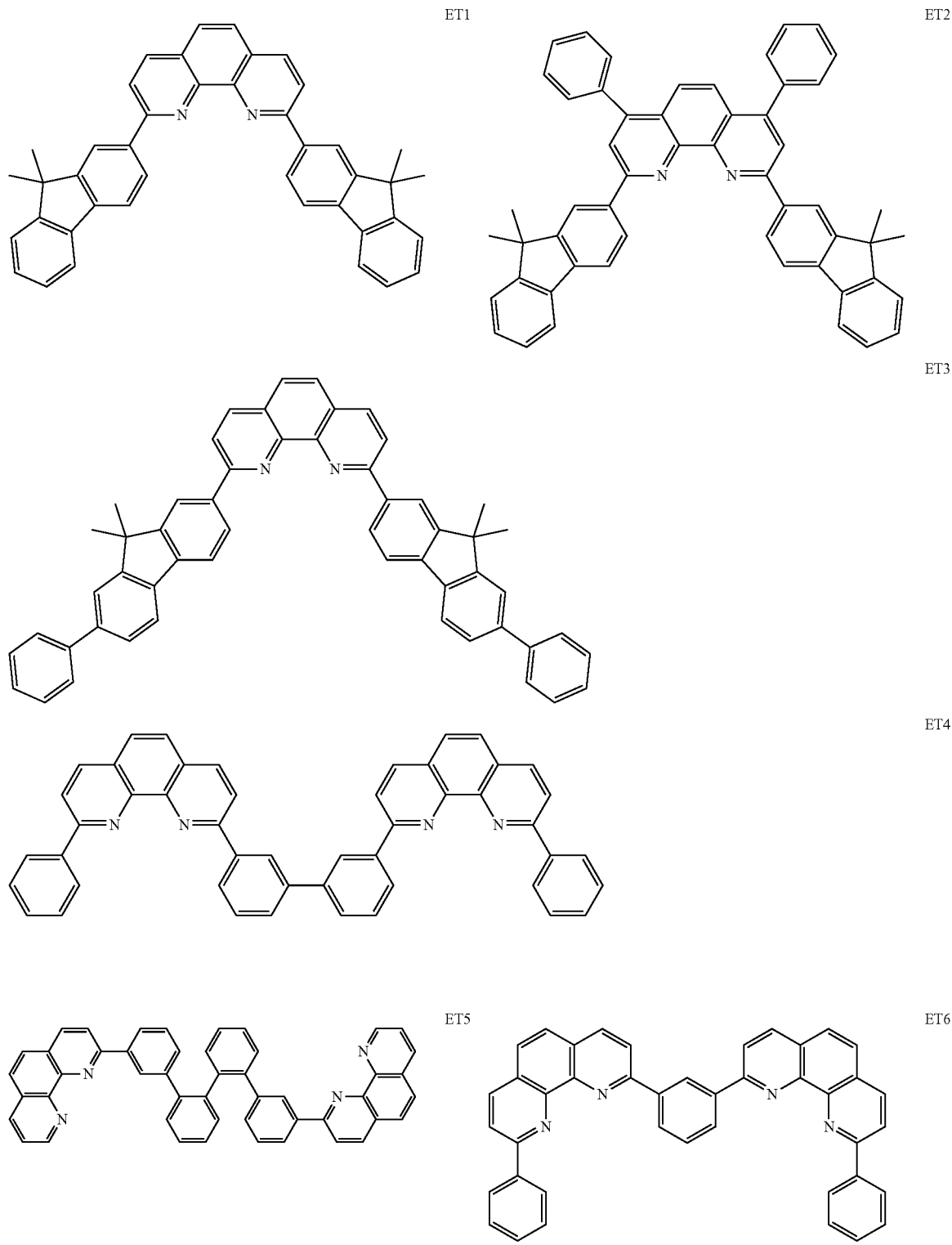

ET7
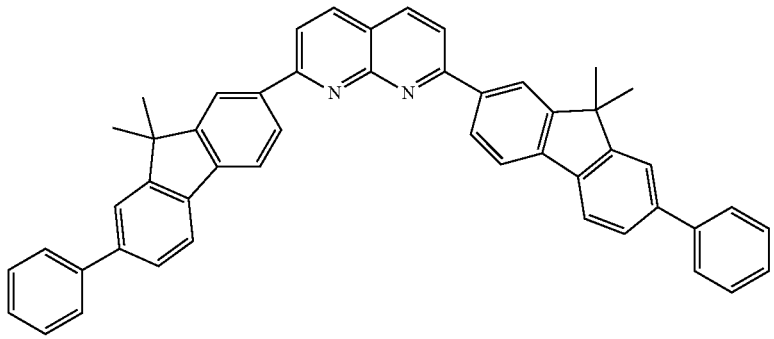
ET8
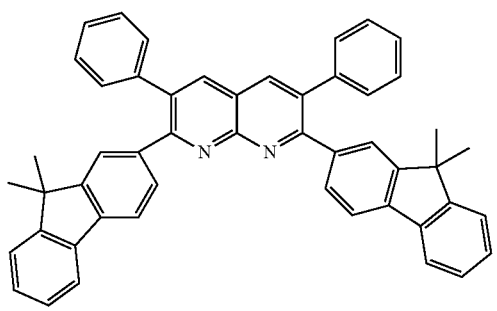
ET9
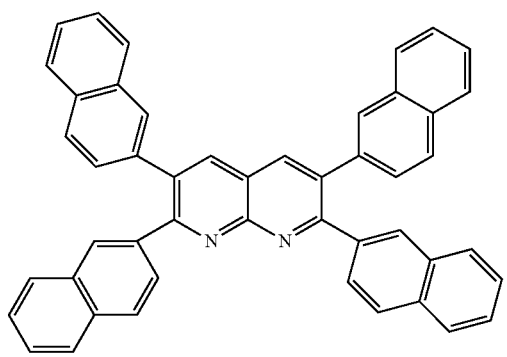
ET10
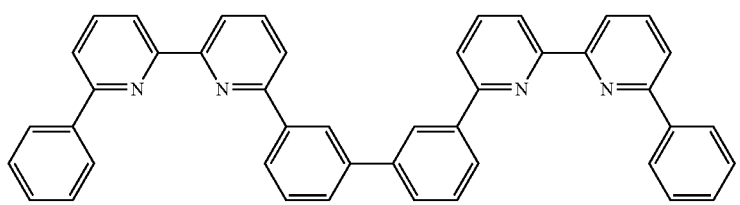
ET11
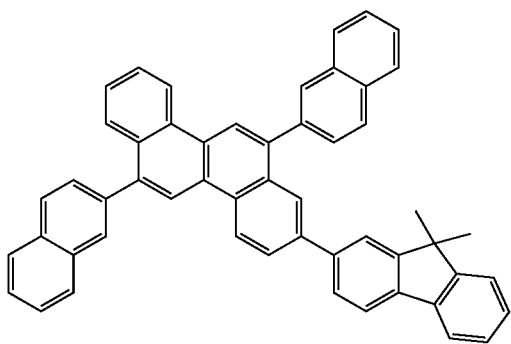
ET12
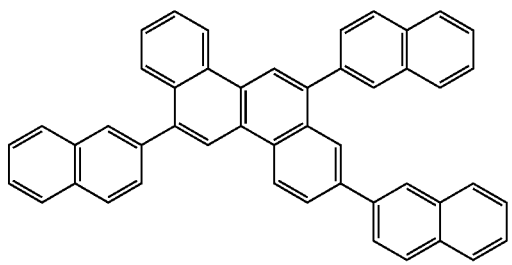

ET13
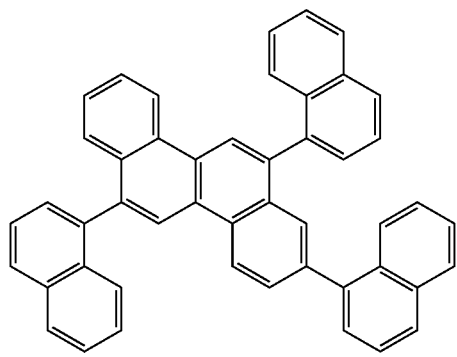
ET14
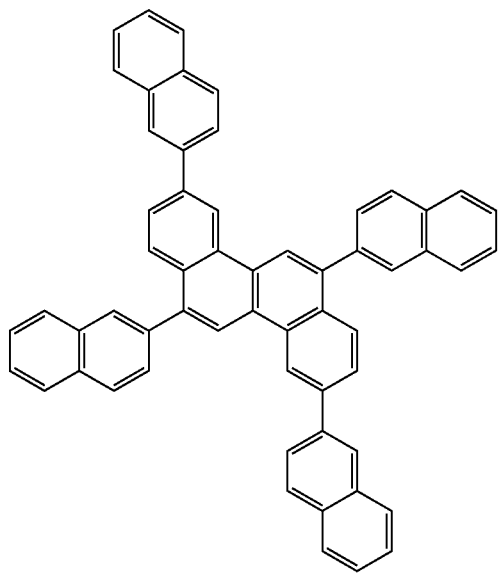
ET15
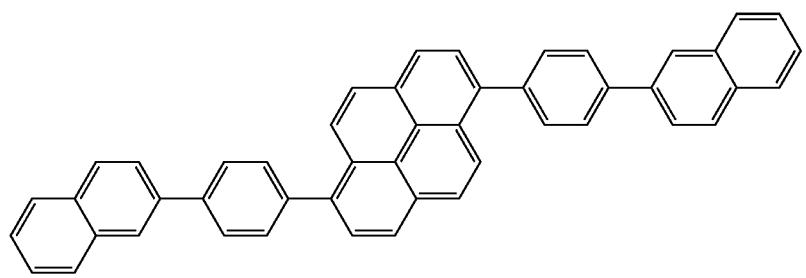
ET16
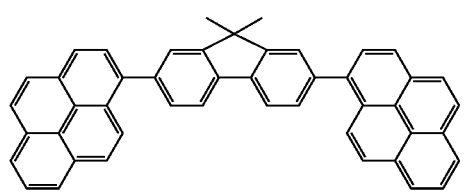
ET17
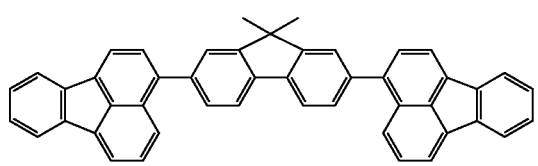
ET18
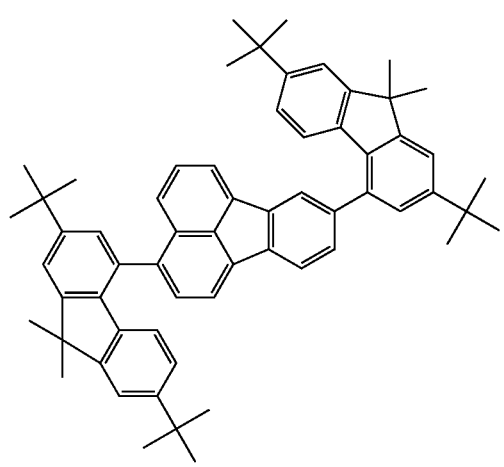
ET19
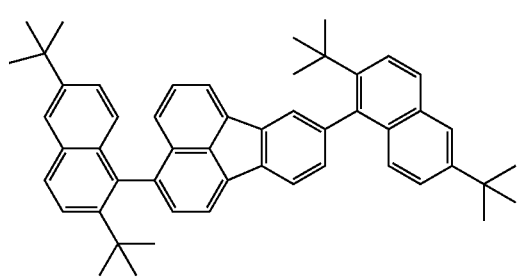

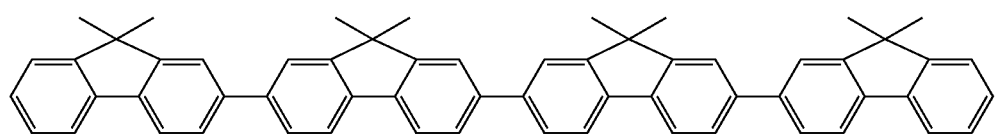

ET20

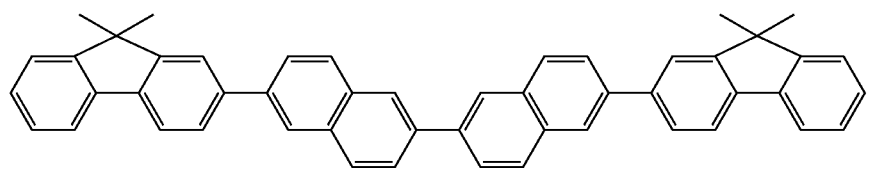

ET21

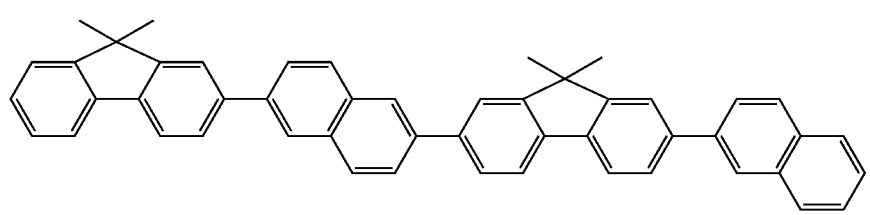

ET22

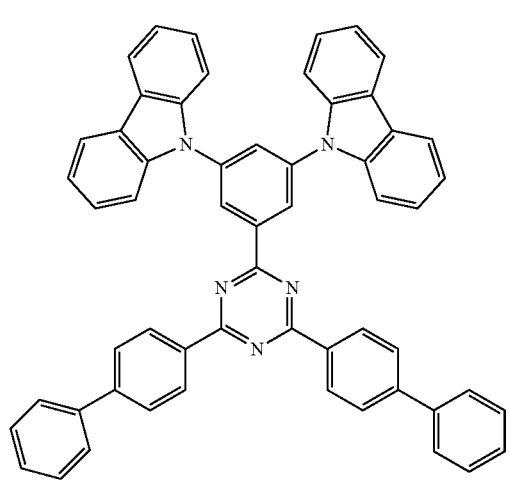

ET23

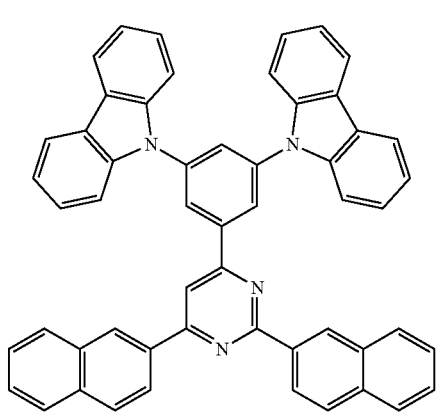

ET24

Among these examples of the electron transport materials, the electron transport material A is preferably, from the viewpoint of the above-described bonding stability, ET11 to ET22, which are constituted by hydrocarbons alone. Use of these electron transport materials provides organic light emitting devices having good durability characteristics. The electron transport material B is preferably, from the viewpoint of the above-described electron injection properties, ET1 to ET10, ET23, and ET24, which include nitrogen-containing aromatic rings.

Hereinafter, specific examples of the hole transport material used for an organic light emitting device according to an embodiment of the present disclosure will be described. The hole injection transport material can be a material that facilitates injection of holes from the anode, and that has a high hole mobility in order to transport the injected holes to the light emitting layer. Examples of low-molecular-weight or high-molecular-weight materials having such hole injection transport performance include triaryl amine derivatives, aryl carbazole derivatives, phenylenediamine derivatives, stilbene derivatives, phthalocyanine derivatives, porphyrin derivatives, poly(vinylcarbazole), poly(thiophene), and other conductive polymers. Such a hole injection transport material can also be used for the electron blocking layer.

The following are non-limiting specific examples of compounds used as the hole injection transport material.

HT1 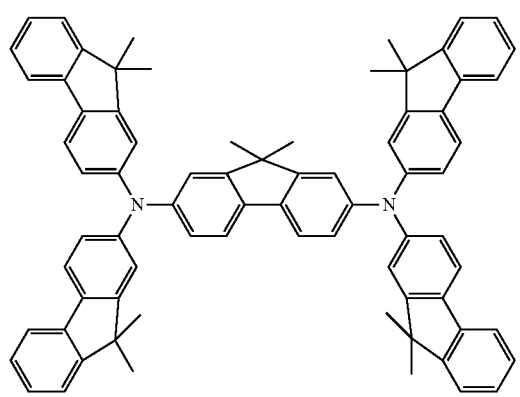
HT2 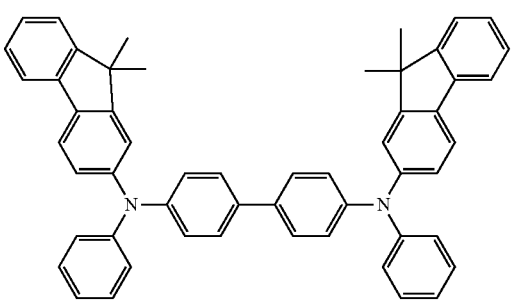
HT3 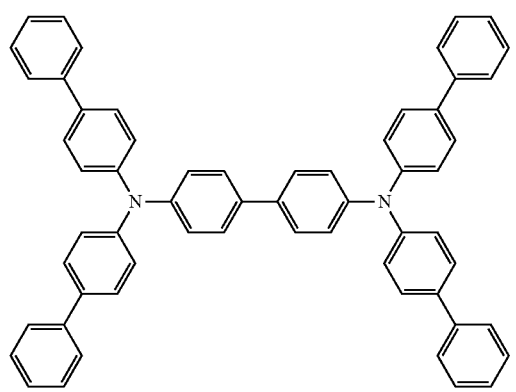
HT4 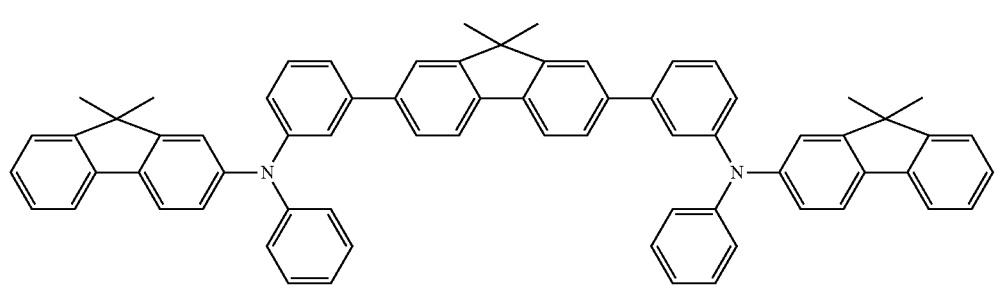
HT5 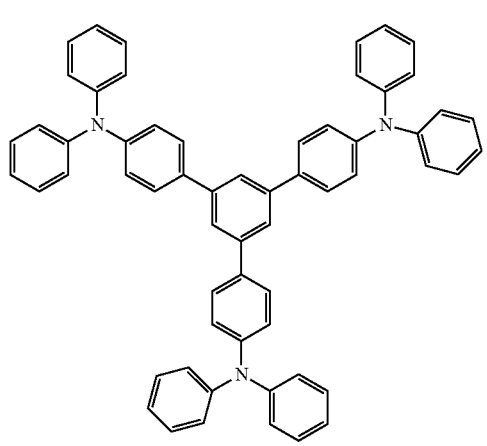
HT6 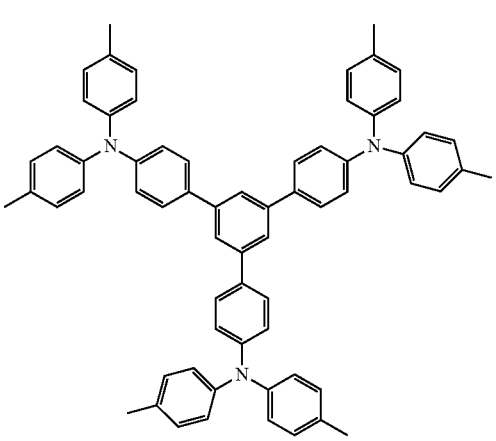

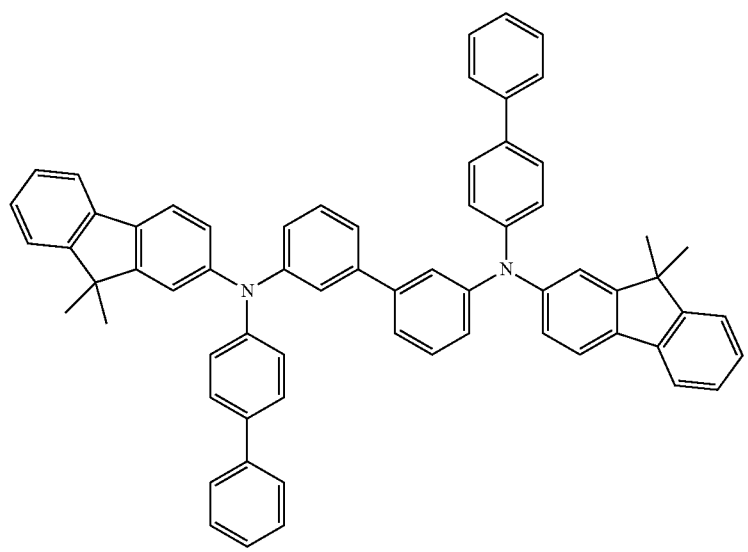
HT7
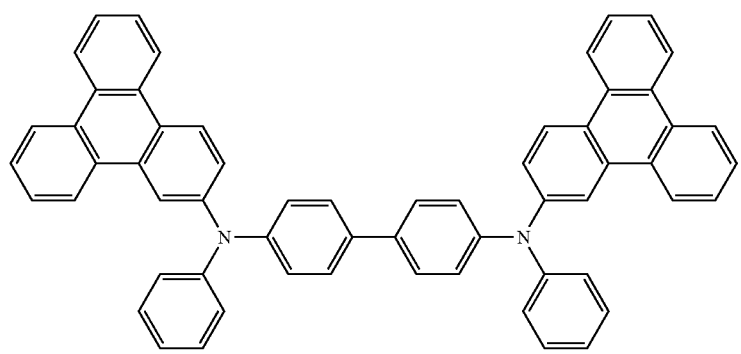
HT8
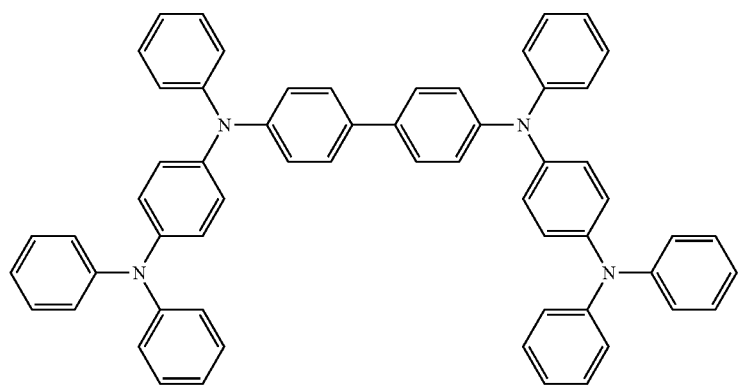
HT9

-continued
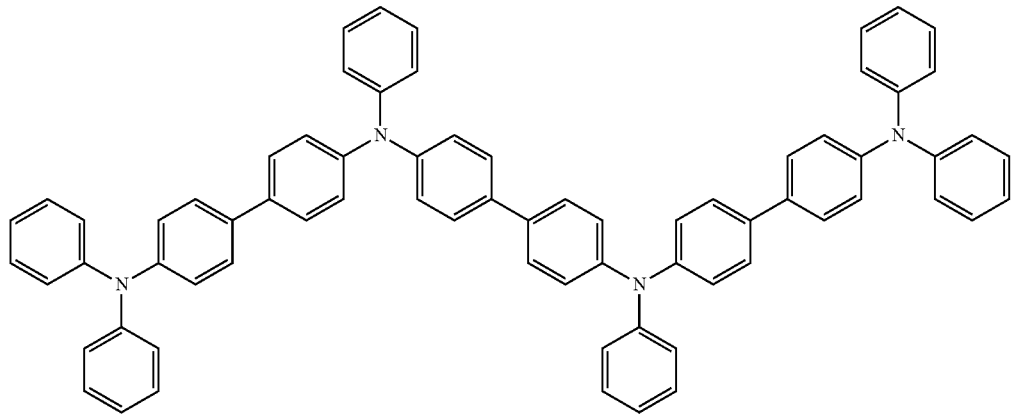
HT10
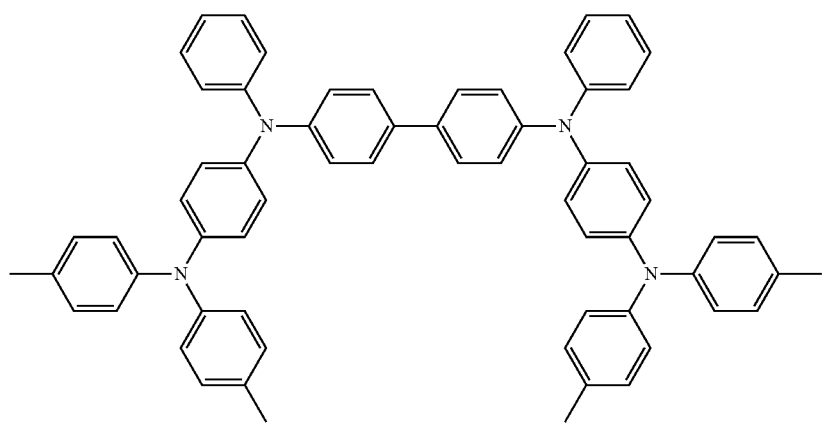
HT11
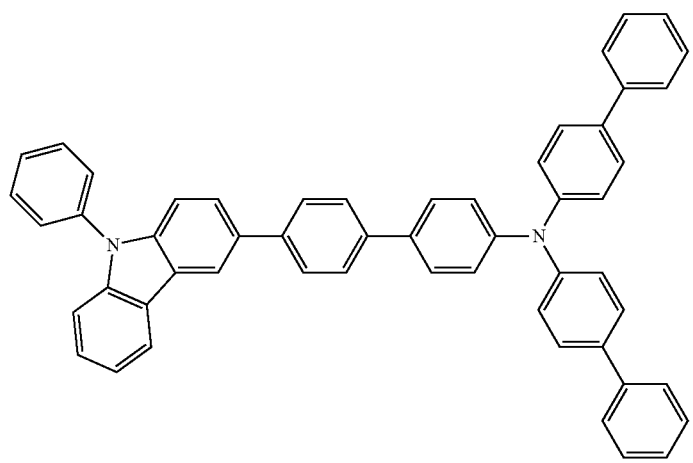
HT12

-continued

HT13
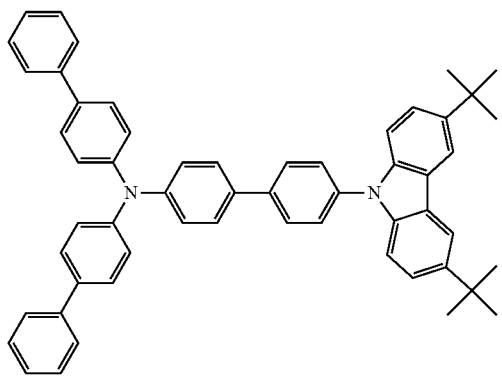

HT14
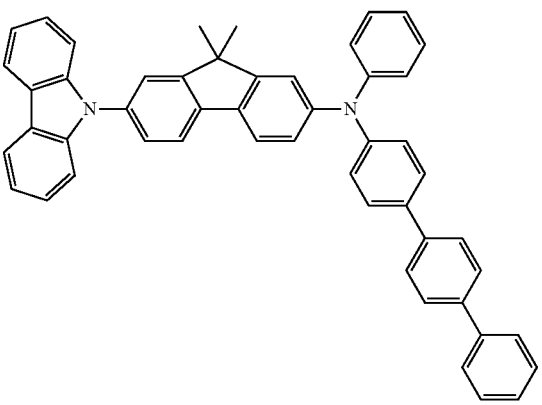

HT15
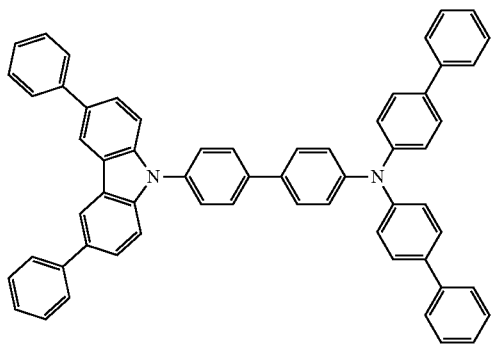

HT16
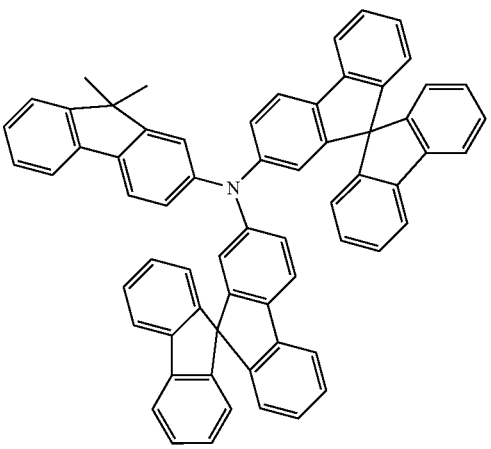

HT17
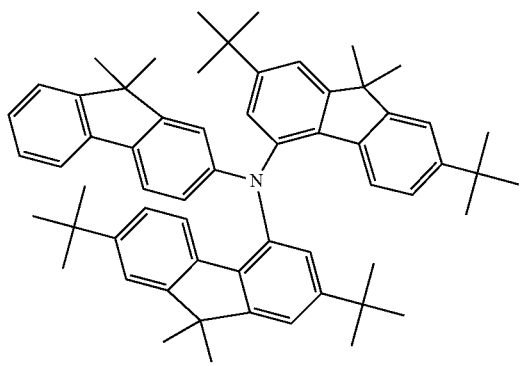

HT18
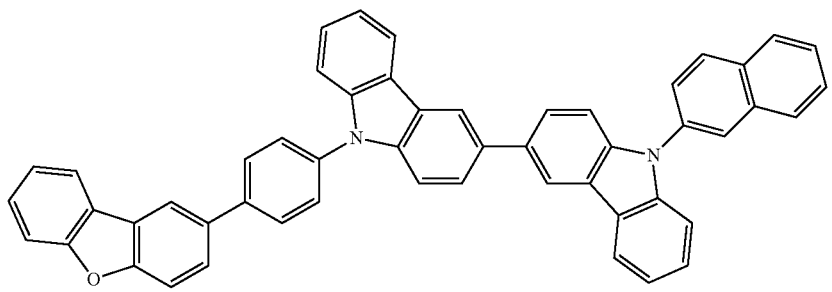

Hereinafter, specific examples of a light emitting material used for an organic light emitting device according to an embodiment of the present disclosure will be described. Examples of a light emitting material mainly contributing to a light emission function include condensed polycyclic compounds (such as fluorene derivatives, naphthalene derivatives, pyrene derivatives, perylene derivatives, tetracene derivatives, anthracene derivatives, and rubrene), quinacridone derivatives, coumarin derivatives, stilbene derivatives, organoaluminum complexes such as aluminum tris(8-quinolinolate), iridium complexes, platinum complexes, rhenium complexes, copper complexes, europium complexes, ruthenium complexes, and polymer derivatives such as poly(phenylenevinylene) derivatives, poly(fluorene) derivatives, and poly(phenylene) derivatives.

A light emitting layer host or light emission assist material included in the light emitting layer may be a condensed polycyclic compound. More specifically, the compound has an aryl group such as benzene, naphthalene, fluorene, benzofluorene, phenanthrene, chrysene, triphenylene, pyrene, fluoranthene, or benzofluoranthene. The aryl group may have, as a substituent, an alkyl group. Specifically, the alkyl group may be an alkyl group having 1 to 12 carbon atoms. In addition to these compounds, other examples of the material include carbazole derivatives, dibenzofuran derivatives, dibenzothiophene derivatives, organoaluminum complexes such as aluminum tris(8-quinolinolate), and organoberyllium complexes.

The following are specific examples of the light emitting layer host material used for an organic light emitting device according to an embodiment of the present disclosure. However, the following compounds are merely specific examples and do not limit the present invention.

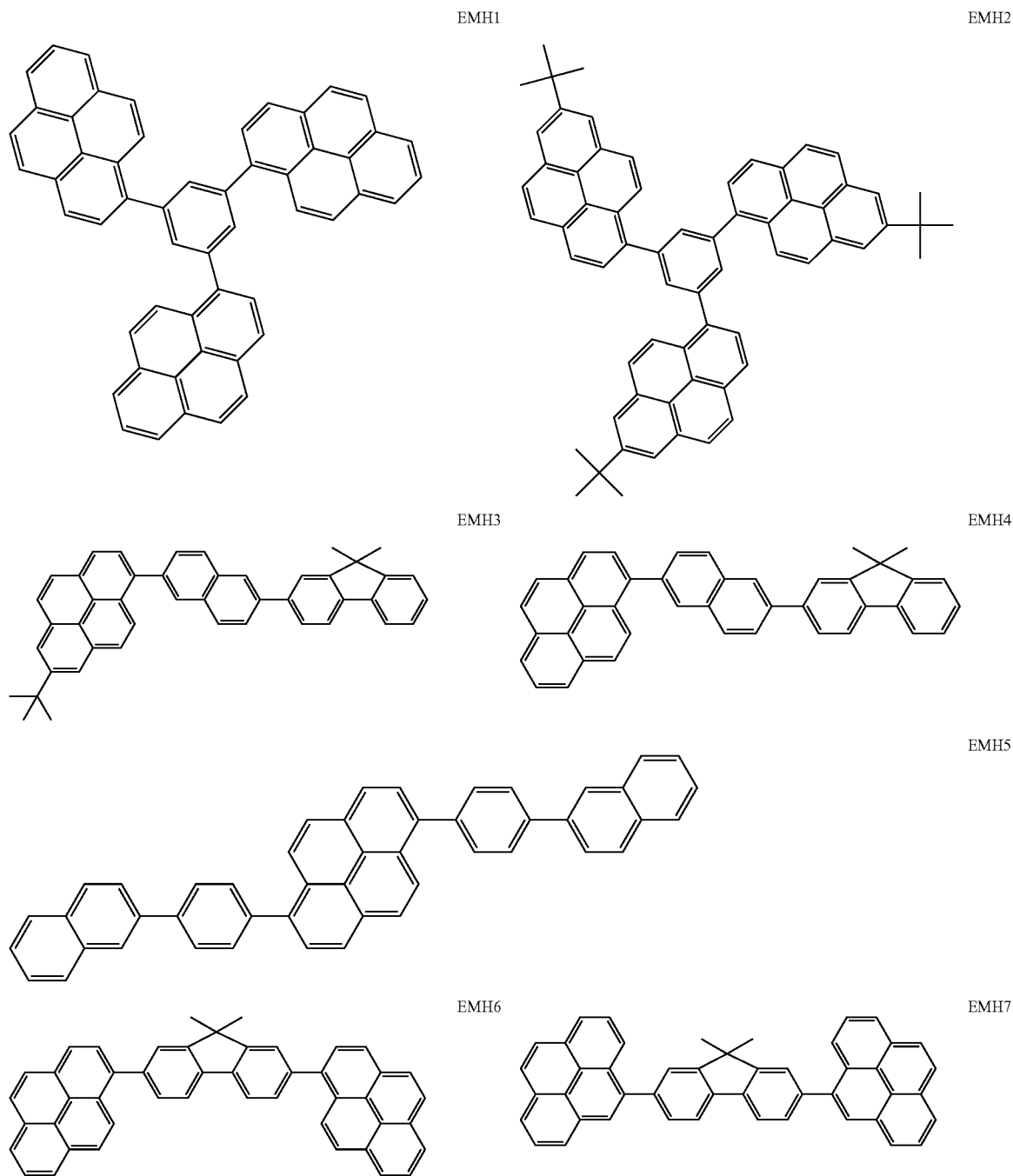

-continued
EMH8
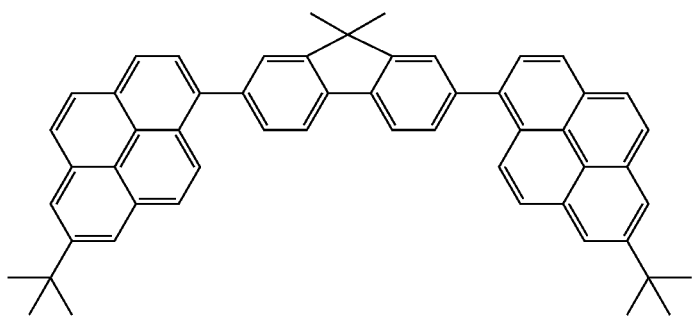
EMH9
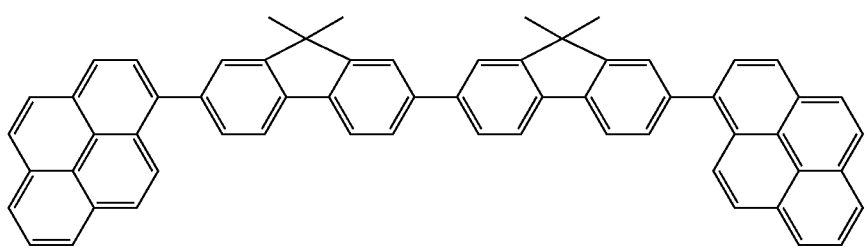
EMH10
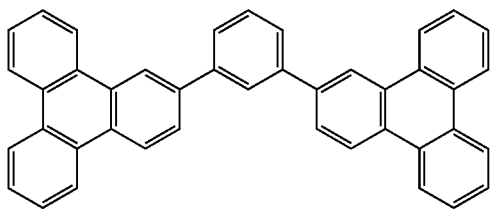
EMH11
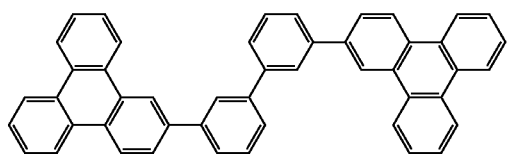
EMH12
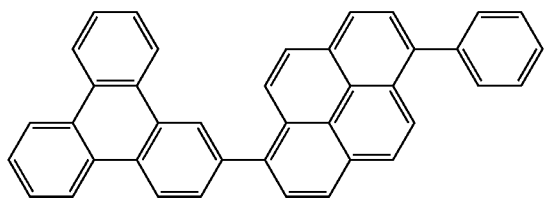
EMH13
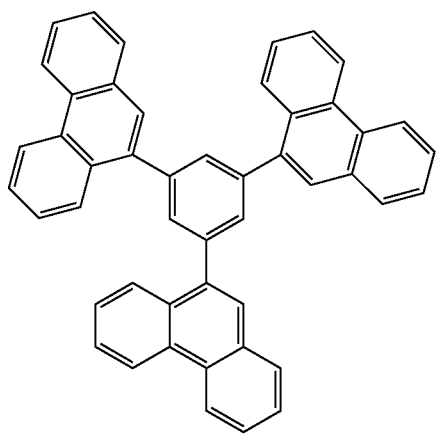
EMH14
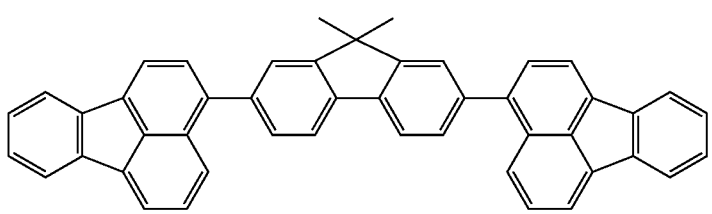

-continued
EMH15
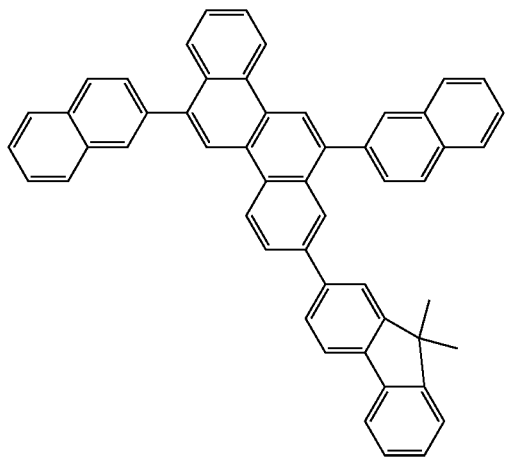
EMH16
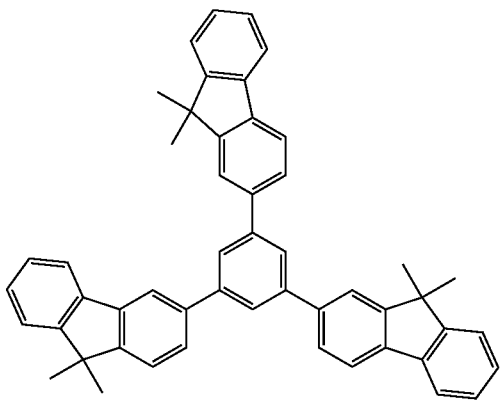
EMH17
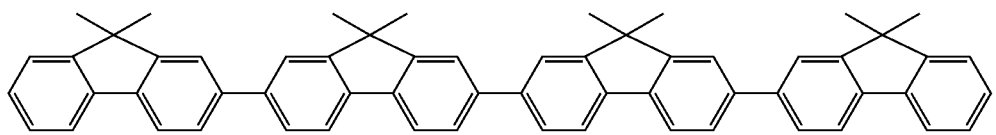
EMH18
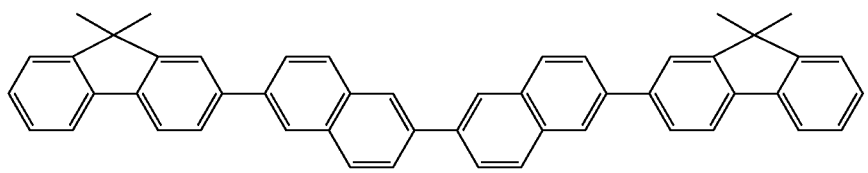
EMH19
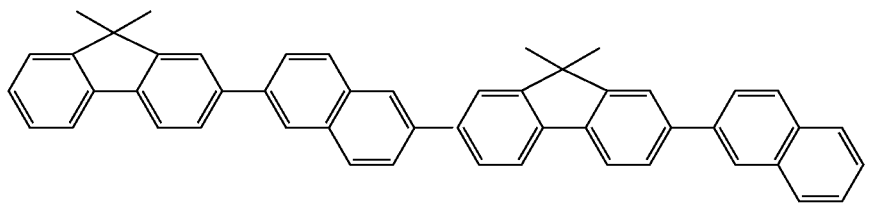
EMH20
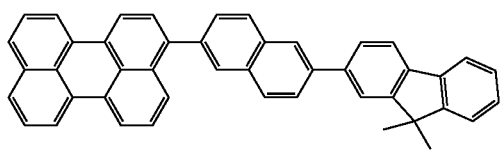
EMH21
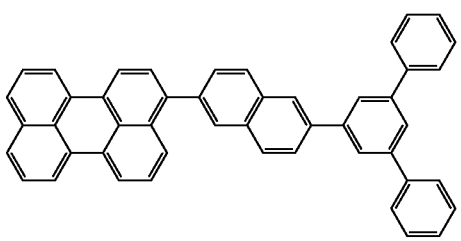
EMH22
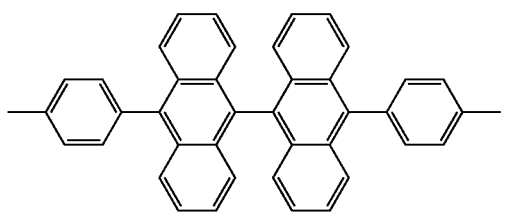
EMH23
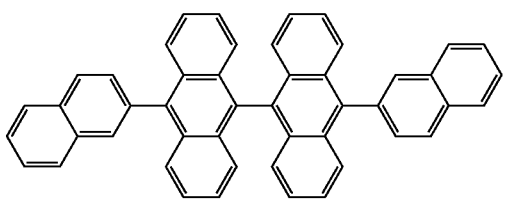

-continued
EMH24
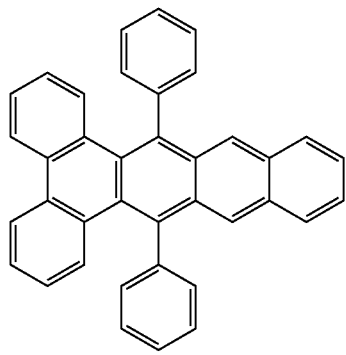
EMH25
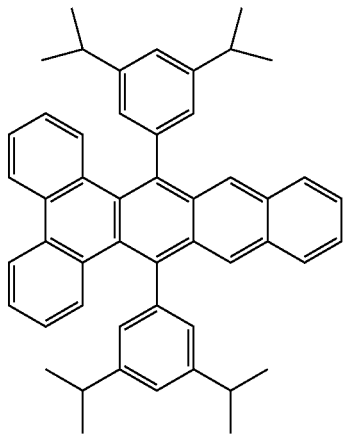
EMH26
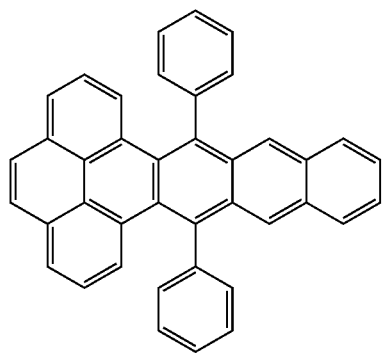
EMH27
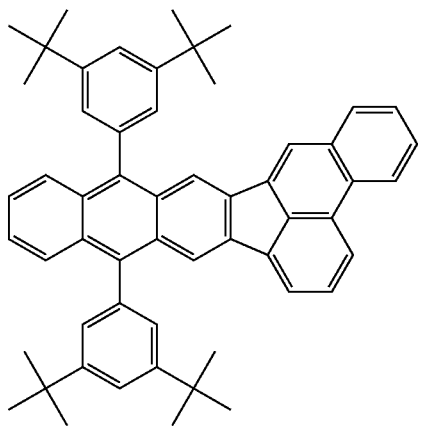
EMH28
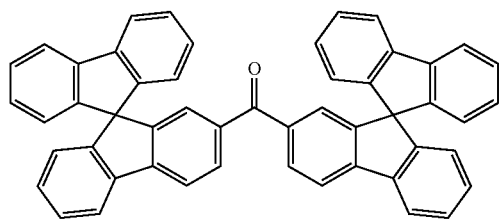
EMH29
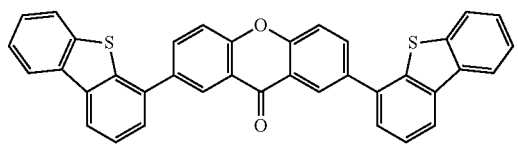
EMH30
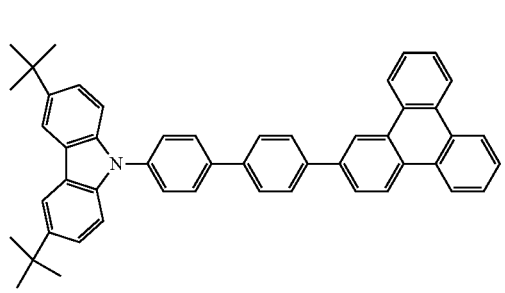
EMH31
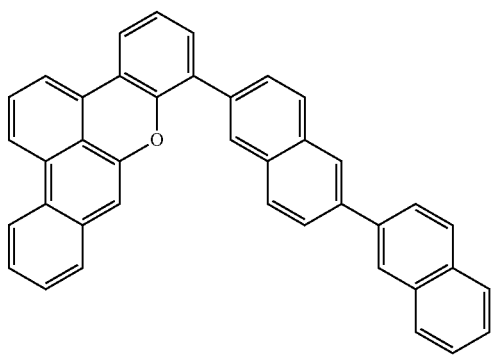

Among these host materials as examples, from the viewpoint of the above-described bonding stability, preferred are EMH1 to EMH27, which are constituted by hydrocarbons alone; more preferred are EMH1 to EMH21, which do not have acene structures such as anthracene and tetracene. This is because use of such host materials provides organic light emitting devices having good durability characteristics.

The following are examples of a blue dopant used for an organic light emitting device according to an embodiment of the present disclosure. However, the present invention is not limited to these examples.

BD1

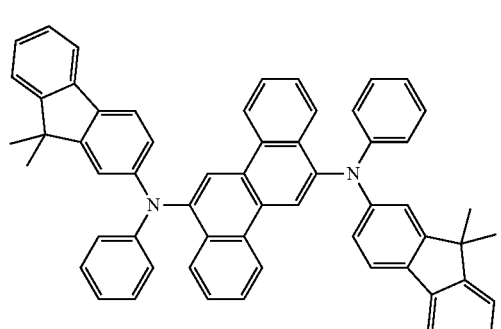

BD2

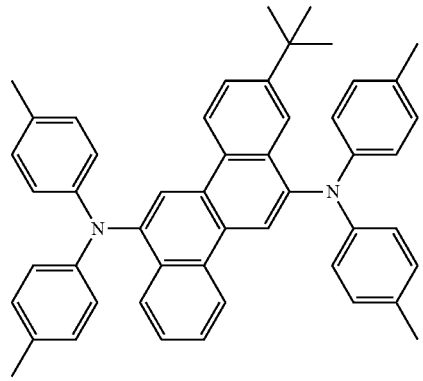

BD3

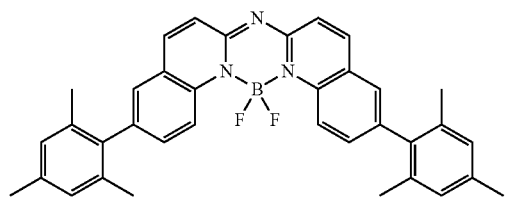

BD4

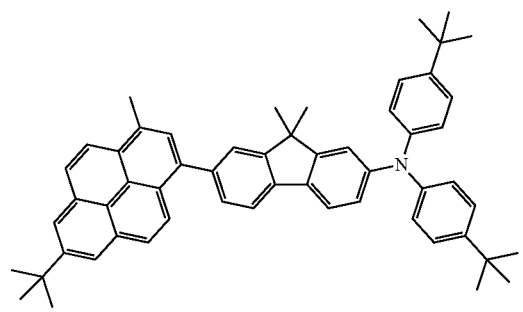

BD5

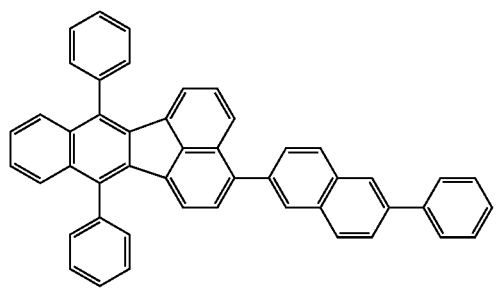

BD6

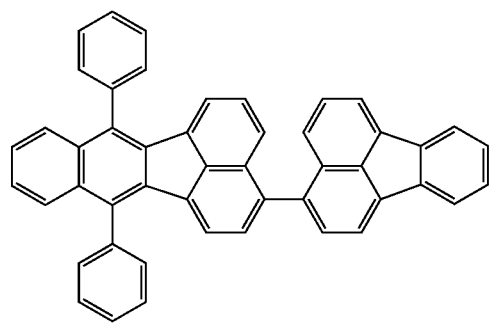

BD7

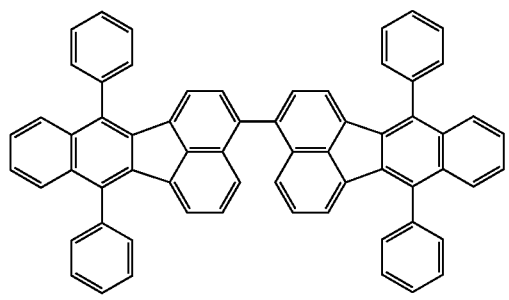

BD8

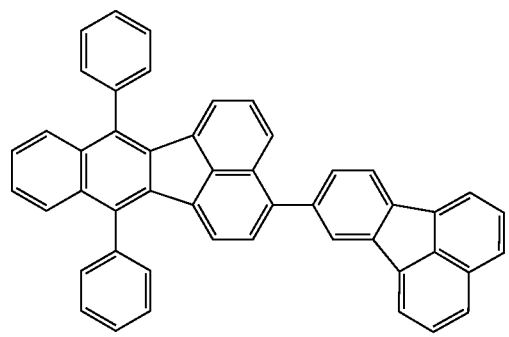

-continued
BD9
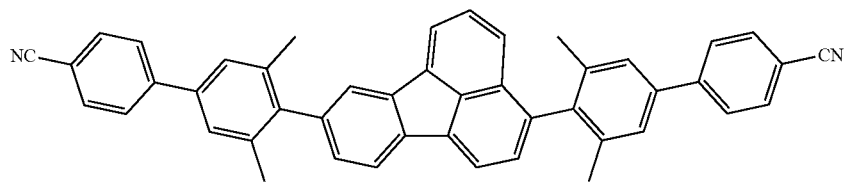
BD10
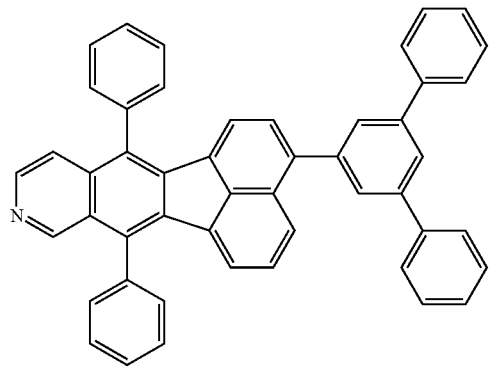
BD11
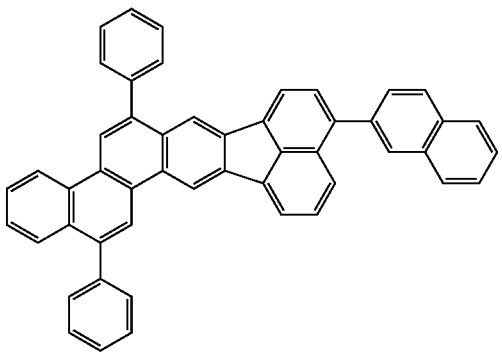
BD12
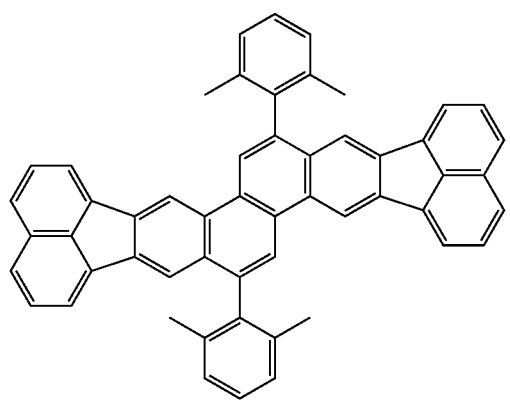
BD13
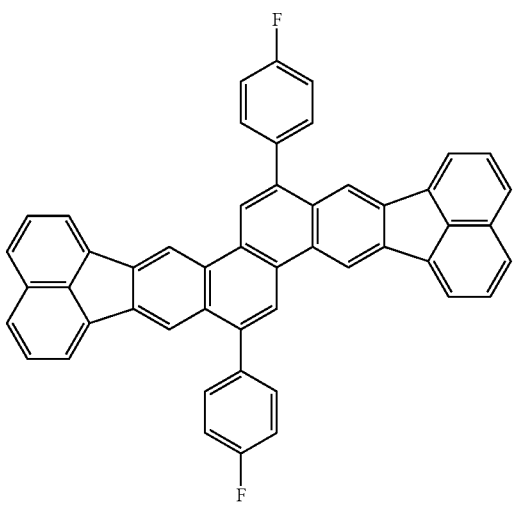
BD14
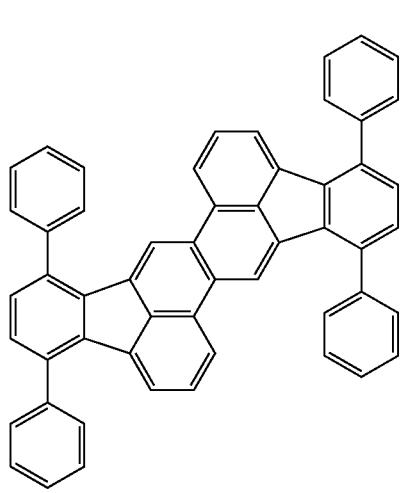
BD15
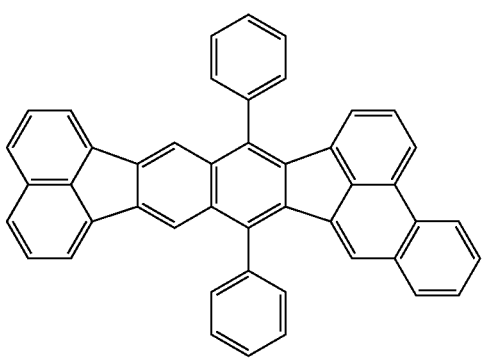

-continued
BD16
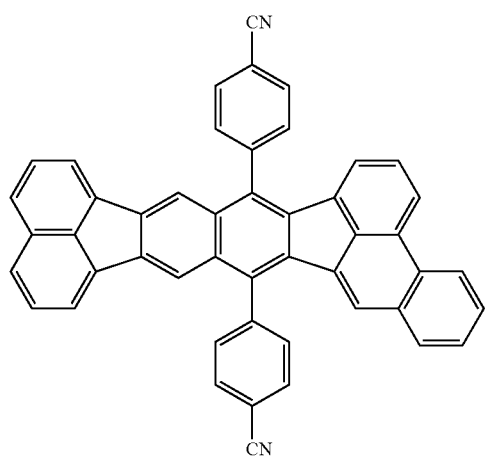
BD17
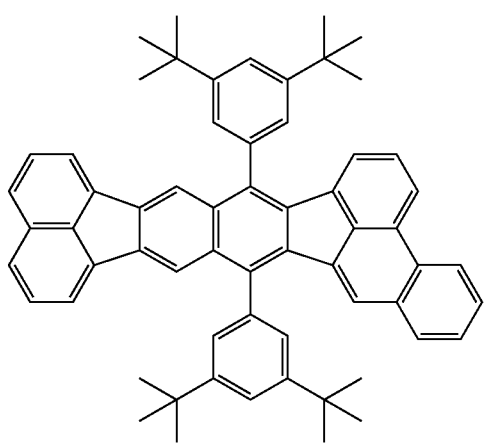
BD18
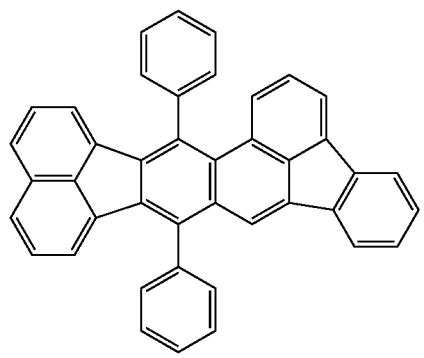
BD19
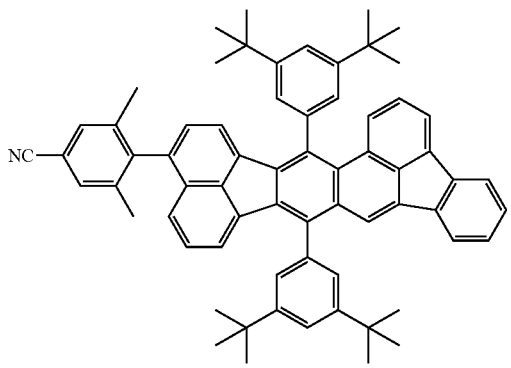
BD20
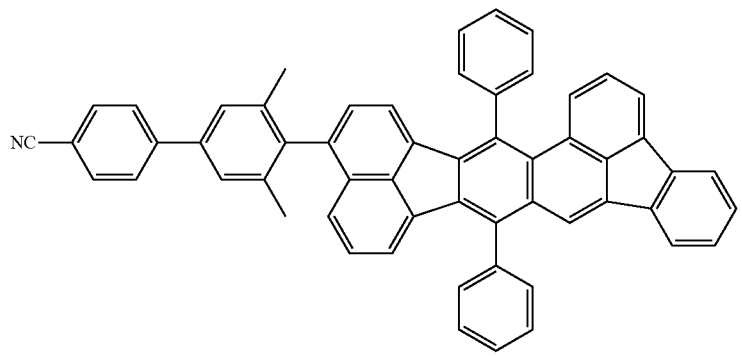
BD21
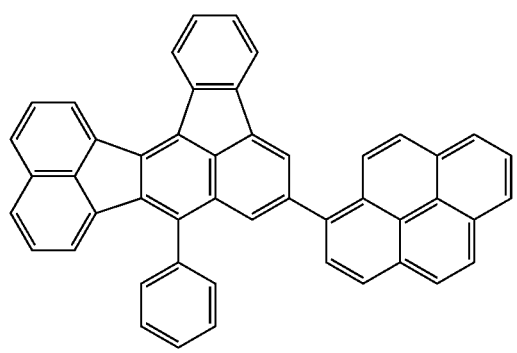
BD22
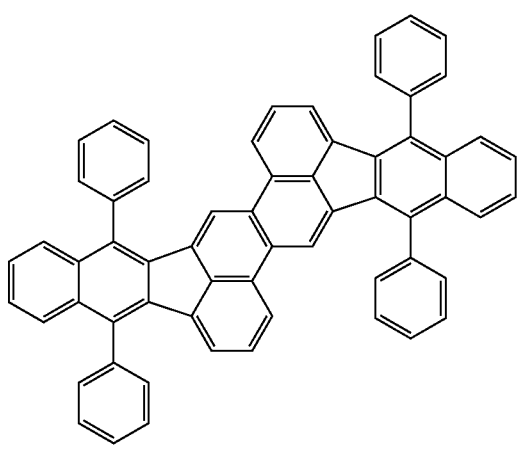

-continued
BD23
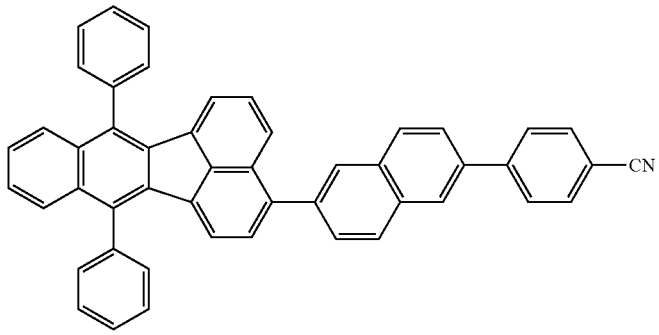
BD24
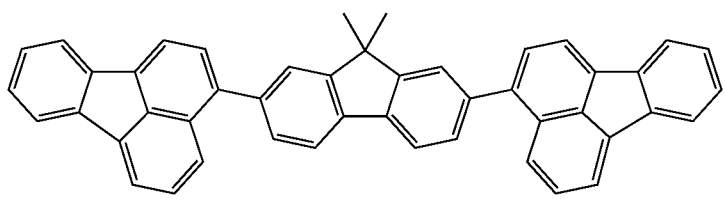
BD25
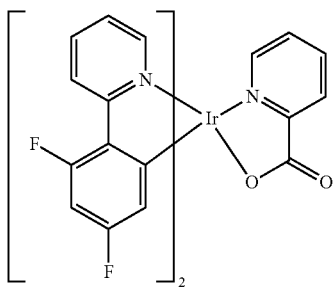
BD26
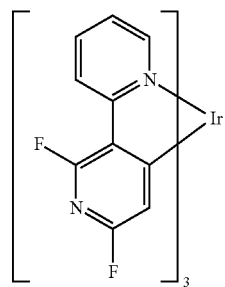
BD27
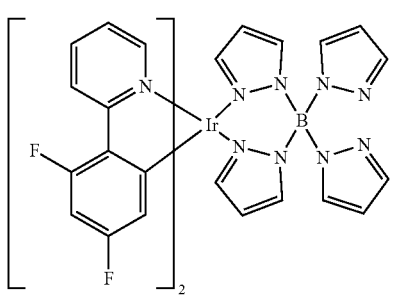

Among these examples of the blue dopant, particularly preferred are compounds not having substituted amino groups, which have low bond energy. The doping concentrations of such blue dopants are each desirably 0.1 to 10.0 wt %, more preferably 0.3 to 5.0 wt %.

The following are examples of a green dopant used for an organic light emitting device according to an embodiment of the present disclosure. However, the present invention is not limited to these examples.

GD1

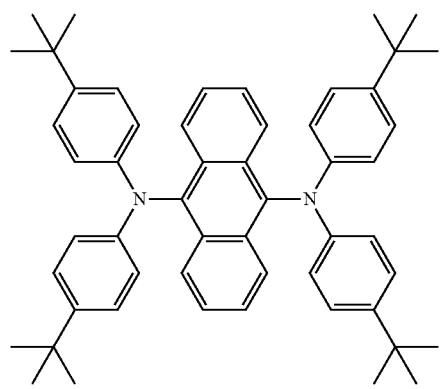

GD2

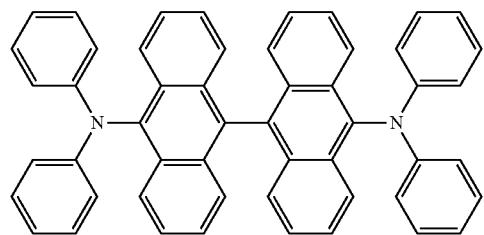

GD3

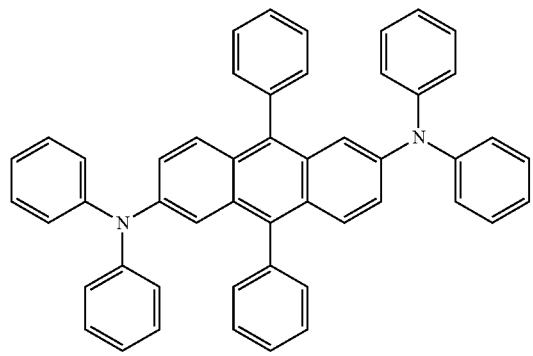

GD4

GD5

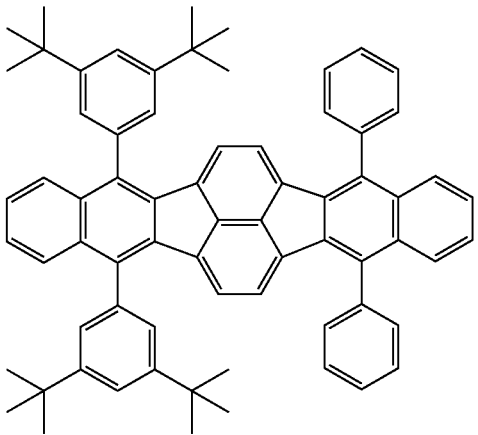

GD6

GD7

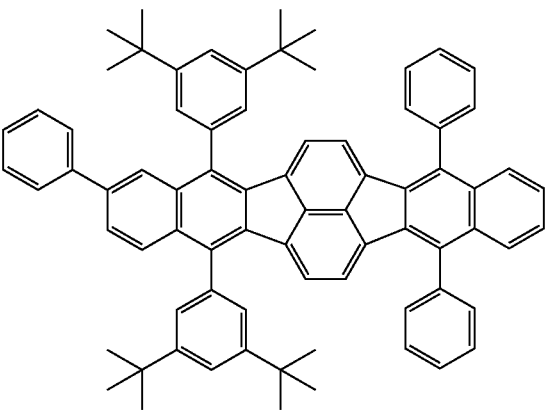

GD8
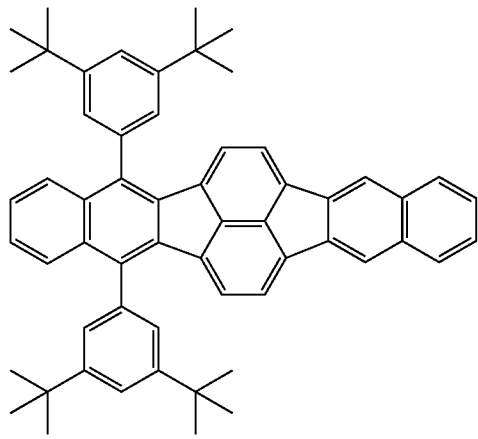
GD9
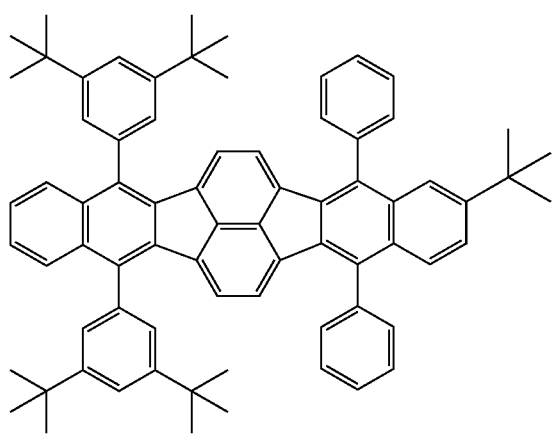
GD10
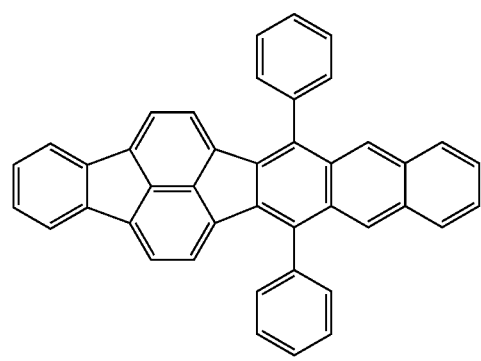
GD11
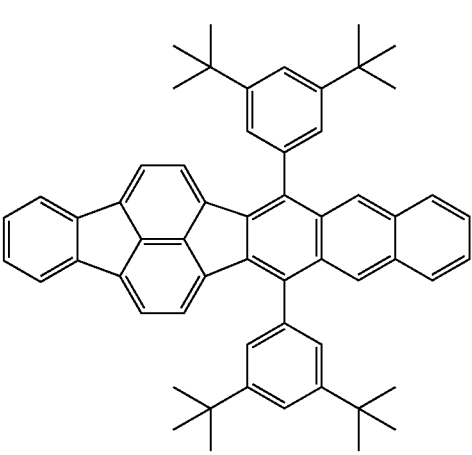
GD12
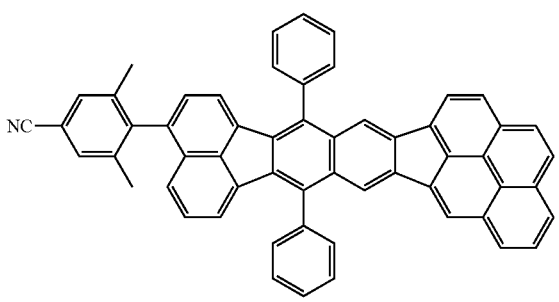
GD13
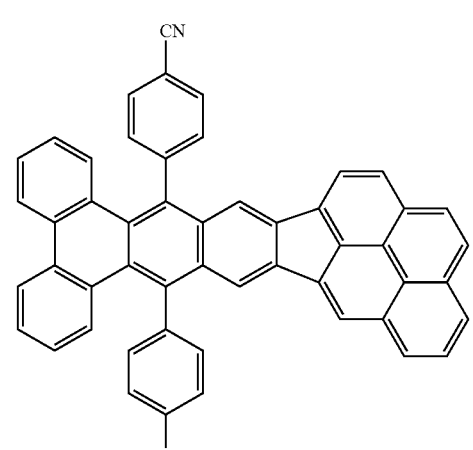
GD14
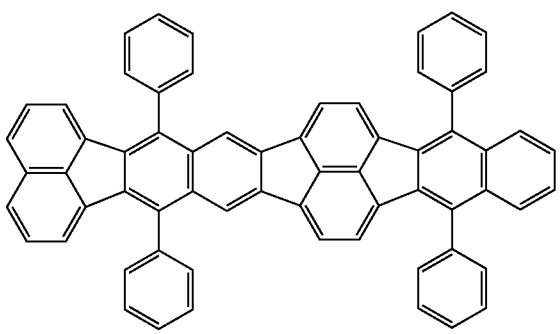

GD15
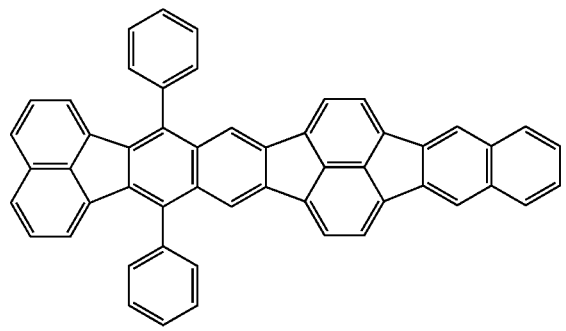
GD16
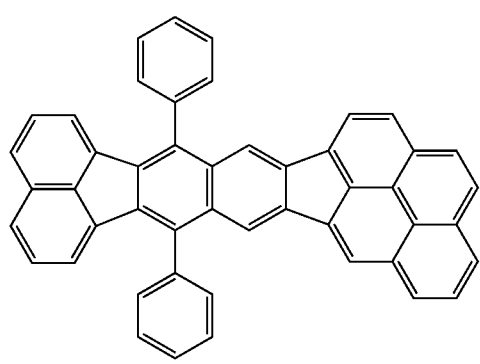
GD17
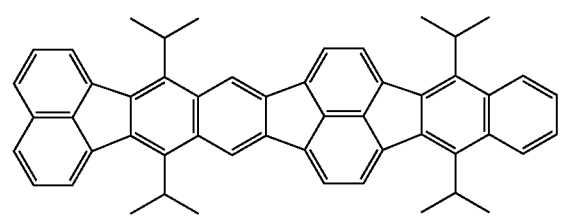
GD18
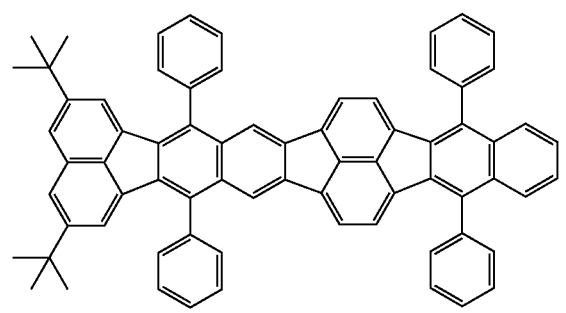
GD19
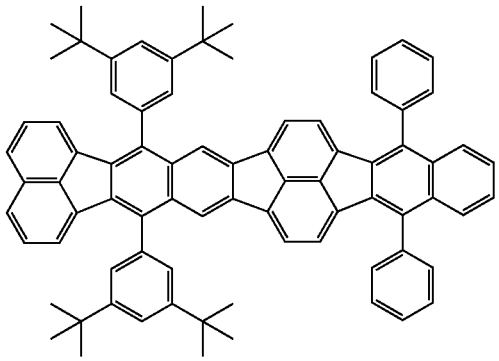
GD20
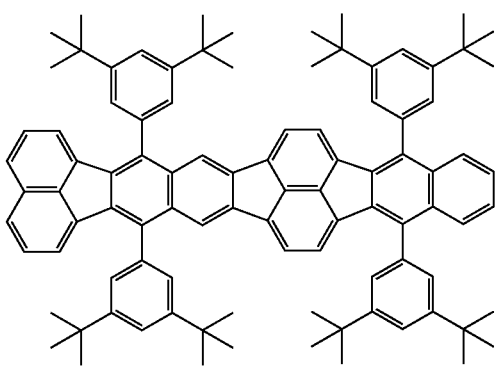
GD21
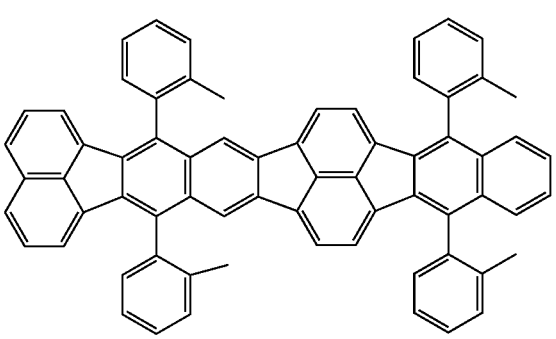
GD22
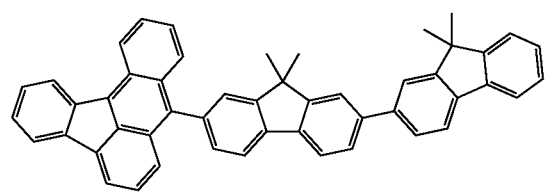
GD23
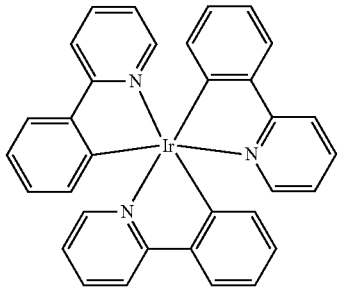

GD24

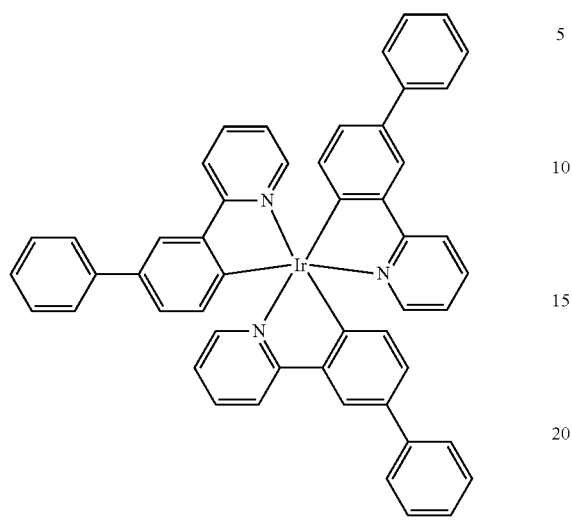

Among these examples of the green dopant, particularly preferred are compounds not having substituted amino groups, which have low bond energy. The doping concentrations of such green dopants are each desirably 0.1 to 10.0 wt %, more preferably 0.1 to 5.0 wt %.

The following are examples of a red dopant used for an organic light emitting device according to an embodiment of the present disclosure. However, the present invention is not limited to these examples.

RD1

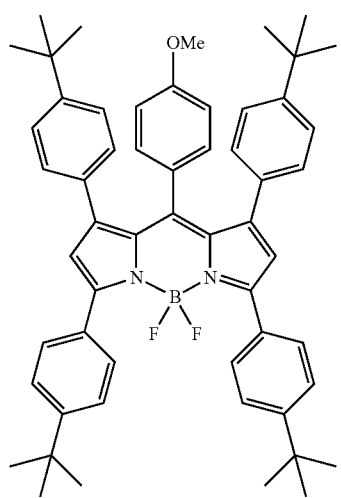

RD2

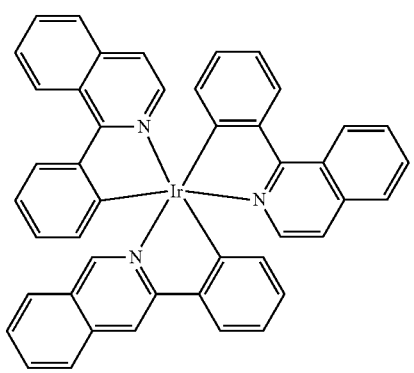

RD3

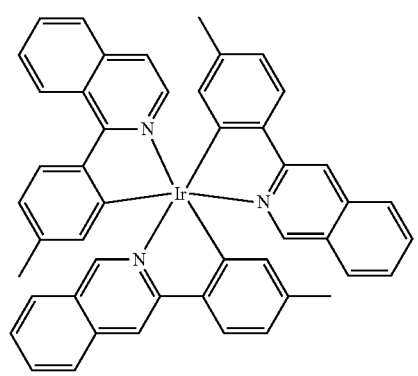

RD4

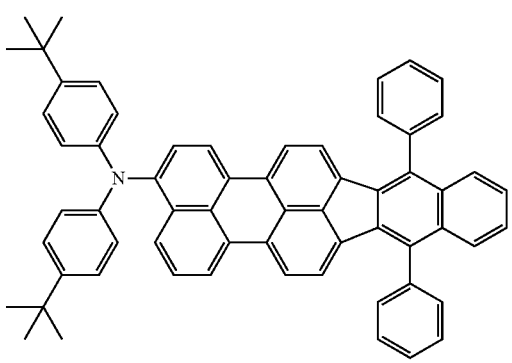

RD5
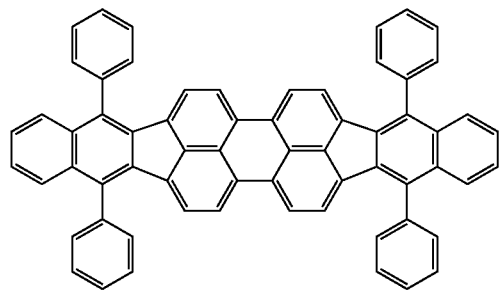
RD6
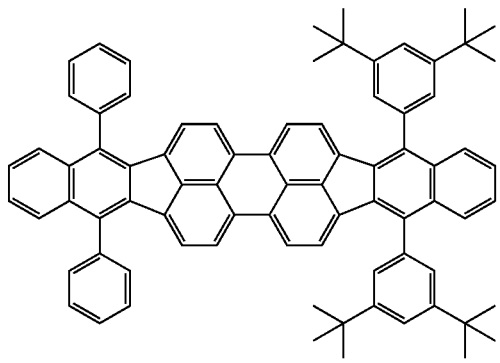
RD7
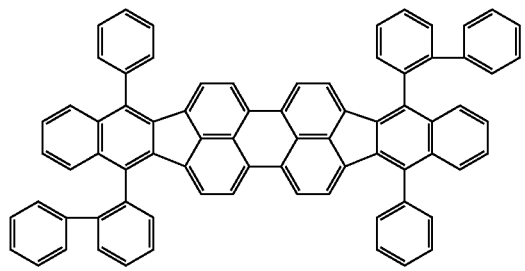
RD8
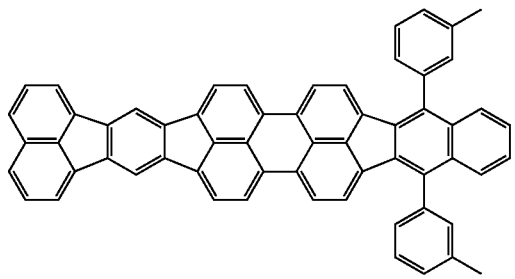
RD9
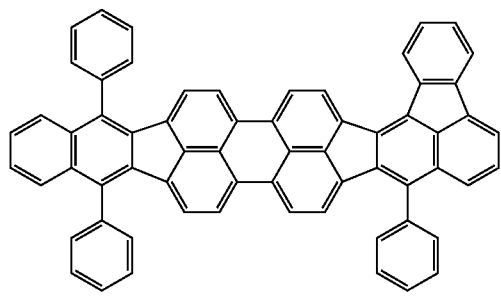
RD10
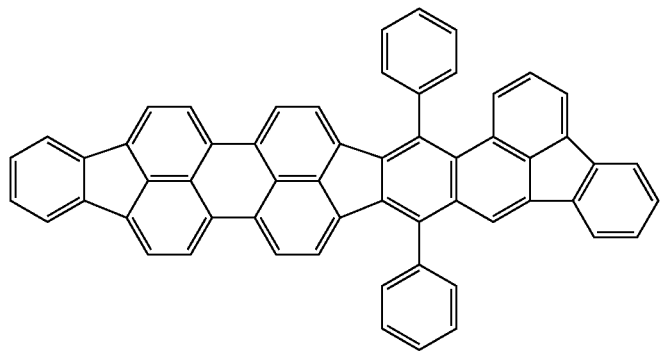

-continued
RD11
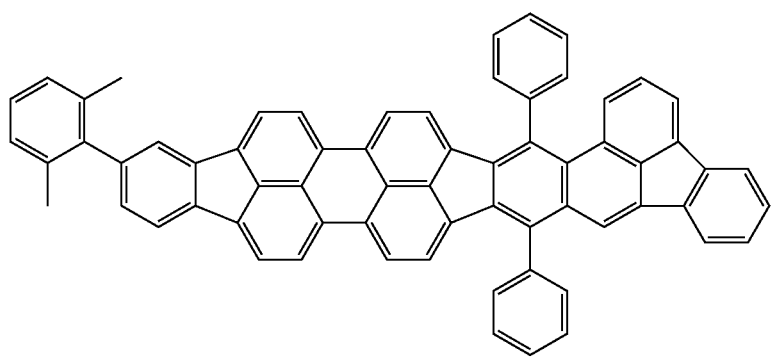
RD12
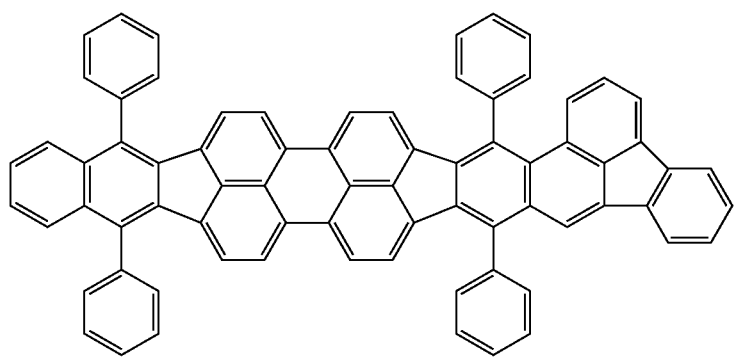
RD13
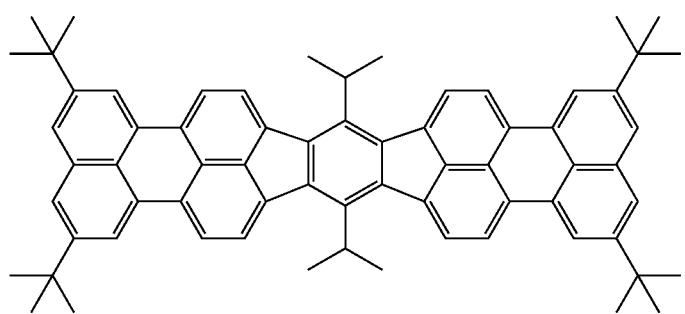
RD14
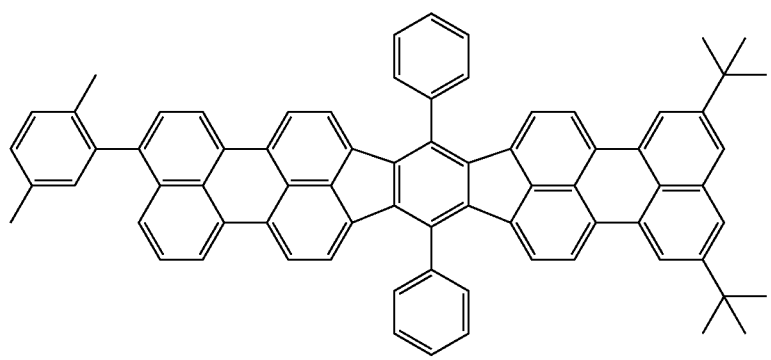

RD15
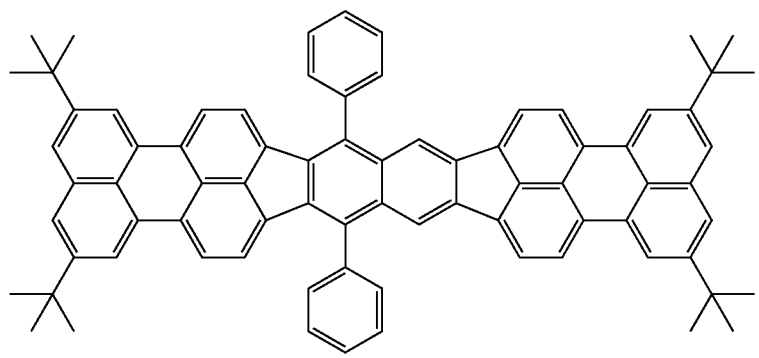
RD16
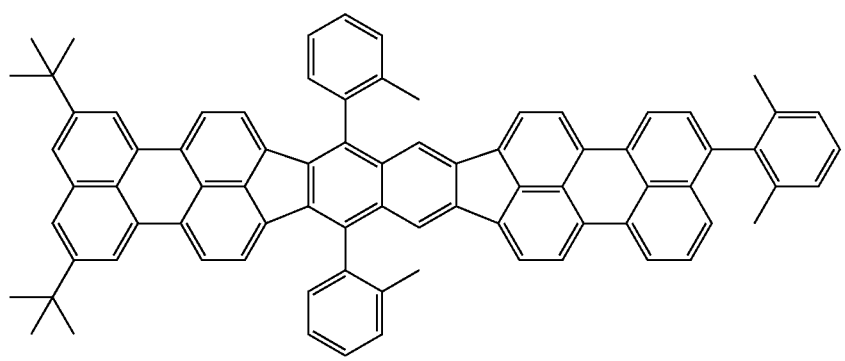
RD17
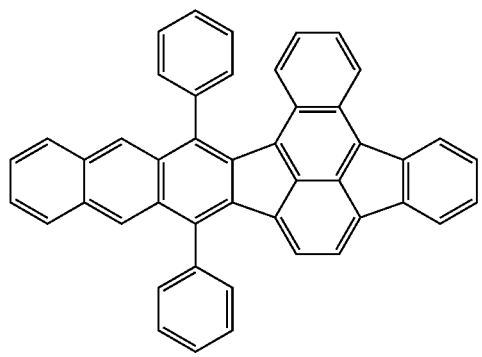
RD18
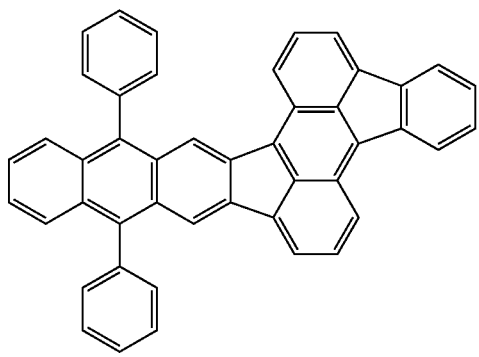
RD19
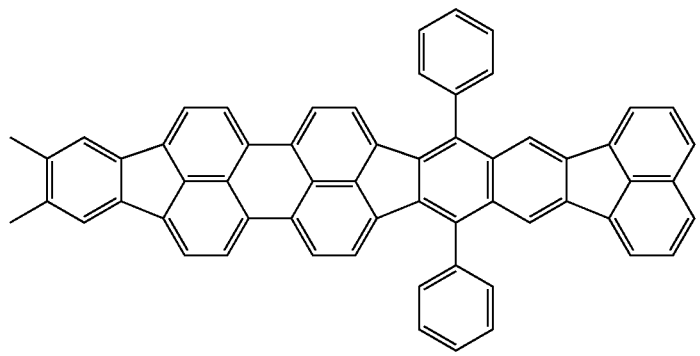

-continued

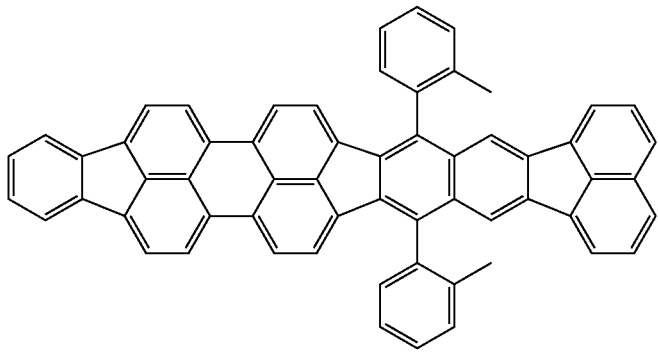
RD20

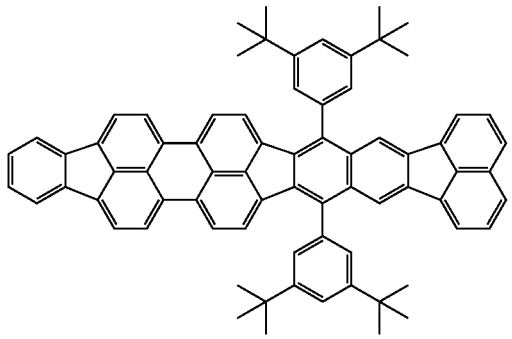
RD21

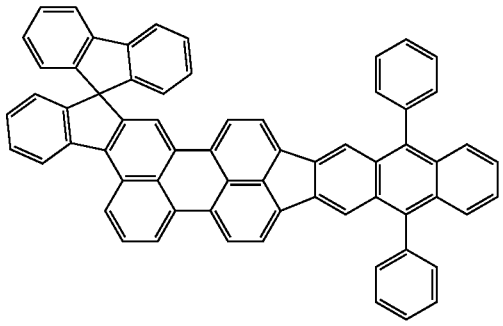
RD22

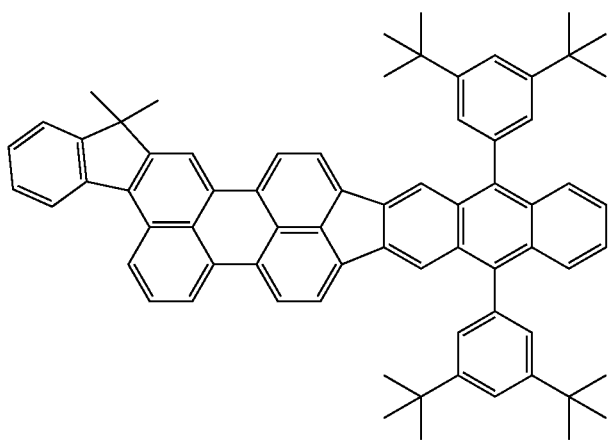
RD23

Among these examples of the red dopant, particularly preferred are compounds not having substituted amino groups, which have low bond energy. More preferred are compounds constituted by hydrocarbons alone. The doping concentrations of such red dopants are each desirably 0.1 to 5.0 wt %, more preferably 0.1 to 0.5 wt %.

Organic Light Emitting Device According to this Embodiment

The organic light emitting device according to this embodiment is an organic electric-field device including a pair of electrodes and an organic compound layer disposed between the pair of electrodes. The organic compound layer includes a light emitting layer.

The organic light emitting device according to this embodiment may include, in addition to the light emitting layer, for example, a hole injection layer, a hole transport layer, an electron blocking layer, a hole blocking layer, an electron transport layer, an electron injection layer, an intermediate layer, a charge generation layer, and a charge separation layer.

The following are examples of the configuration of the organic light emitting device:

Anode/Hole transport layer/First light emitting layer/First electron transport layer/Second electron transport layer/Electron injection layer/Cathode;

Anode/Hole injection layer/Hole transport layer/First light emitting layer/First electron transport layer/Second electron transport layer/Electron injection layer/Cathode;

Anode/Hole injection layer/Hole transport layer/First light emitting layer/Hole blocking layer/First electron transport layer/Second electron transport layer/Electron injection layer/Cathode;

Anode/Hole injection layer/Hole transport layer/First light emitting layer/Second light emitting layer/Hole blocking layer/First electron transport layer/Second electron transport layer/Electron injection layer/Cathode;

Anode/Hole injection layer/Hole transport layer/First light emitting layer/Intermediate layer/Second light emitting layer/Hole blocking layer/First electron transport layer/Second electron transport layer/Electron injection layer/Cathode; and Anode/Hole injection layer/Hole transport layer/First light emitting layer/Second light emitting layer/Third light emitting layer/Hole blocking layer/First electron transport layer/Second electron transport layer/Electron injection layer/Cathode.

However, these device configuration examples are mere basic device configurations. The configuration of the organic light emitting device according to an embodiment of the present disclosure is not limited to these examples.

Various layer configurations can be employed in which, for example, at the interface between an electrode and an organic compound layer, an insulating layer is disposed, or a bonding layer or an interferential layer is disposed.

A charge injection layer including the fifth material may be further disposed between the first electrode and the first charge transport layer. The absolute value of LUMO energy of the fifth material can be equal to or larger than the absolute value of HOMO energy of the first material or the absolute value of HOMO energy of the second material. Such features provide a configuration in which holes are injected.

The organic light emitting device according to this embodiment may have what is called a bottom emission configuration in which light is extracted through the substrate-side electrode, what is called a top emission configuration in which light is extracted on a side opposite from the substrate, or a configuration in which light is extracted through both of the surfaces.

Incidentally, in the present disclosure, the light emitting layer is a layer having a light emission function among organic compound layers disposed between the electrodes. The light emitting layer may include a host material, a dopant material, and an assist material. These materials may also be respectively referred to as a first material, a second material, and a third material.

The host material included in the light emitting layer may have the largest weight percentage among materials included in the light emitting layer. In this case, in other words, the host material is a material forming the matrix of the light emitting layer. More specifically, the host material may be, among materials included in the light emitting layer, a material having a weight percentage of 50 wt % or more in the light emitting layer.

The dopant material included in the light emitting layer may have a lower weight percentage than the host material among the materials included in the light emitting layer. More specifically, the dopant is a light emitting material that provides main light emission (light emission dopant material), and may provide light emission accounting for 50% or more of the region of the emission spectrum of the organic light emitting device. The dopant material may have, within the light emitting layer, a weight percentage of less than 50 wt % relative to materials included in the light emitting layer. The dopant material is also referred to as a guest material.

The dopant material is a compound that provides main light emission and included within the light emitting layer. Specifically, the light emission dopant provides light emission accounting for 50% or more of the region of the emission spectrum of the organic light emitting device.

The concentration of the dopant material relative to 100 wt % of all compounds constituting the light emitting layer is 0.01 wt % or more and less than 50 wt %, preferably 0.1 wt % or more and 10 wt % or less. More preferably, the concentration of the dopant material is 0.1 wt % or more and 10 wt % or less in order to suppress concentration quenching. The dopant material may be uniformly included throughout the layer formed of the host material, may be included to have a concentration gradient, or may be partially included in a specified region of the host material layer while another region is left so as not to include the dopant material.

Alternatively, the organic light emitting device according to this embodiment may be an organic light emitting device including a plurality of light emitting layers in which at least one of the plurality of light emitting layers is a light emitting layer that emits light rays of a wavelength different from that of another light emitting layer, and light rays from these light emitting layers are mixed to provide emission of light rays of white.

In an embodiment of the present disclosure, the organic light emitting device may include two or more light emitting layers; each light emitting layer may include light emitting materials that emit light rays of two or more colors.

A first light emitting layer and a second light emitting layer may be in contact with each other; alternatively, another compound layer may be disposed between these light emitting layers. The other compound layer may be a charge generation layer, for example.

Configuration of Organic Light Emitting Device

The organic light emitting device is provided by forming, on a substrate, an anode, an organic compound layer, and a cathode. On the cathode, for example, a protective layer and a color filter may be disposed. When the color filter is disposed, a planarization layer may be disposed between the protective layer and the color filter. The planarization layer may be formed of an acrylic resin, for example.

Substrate

The substrate may be, for example, quartz, glass, a silicon wafer, a resin, or a metal. On the substrate, a switching element such as a transistor and wiring may be disposed, and may be overlain by an insulating layer. The insulating layer is not limited in terms of material as long as a contact hole can be formed therein to ensure electrical connection between the anode 2 and wiring while the insulating layer ensures insulation between the anode 2 and another wiring not connected to the anode 2. Examples of the material include resins such as polyimide, silicon oxide, and silicon nitride.

Electrodes

The electrodes can be a pair of electrodes that are a first electrode and a second electrode. The pair of electrodes may be an anode and a cathode. When an electric field is applied in a direction in which the organic light emitting device emits light, one of the electrodes at a higher potential is the anode, and the other is the cathode. Stated another way, one of the electrodes that supplies holes to the light emitting layer is the anode, and the other electrode that supplies electrons to the light emitting layer is the cathode.

One of the pair of electrodes may be a reflective electrode that reflects light while the other may be a transmissive electrode that transmits light. In such a case of using the combination of the reflective electrode and the transmissive electrode, the thickness of the organic compound layer disposed between the pair of electrodes may be adjusted, to form an optical resonator structure. Alternatively, both of the pair of electrodes may be provided as transmissive electrodes.

The material constituting the anode can have a work function as high as possible. Examples of the material include elemental metals such as gold, platinum, silver, copper, nickel, palladium, cobalt, selenium, vanadium, and tungsten; mixtures including the foregoing; alloys of combinations of the foregoing; metal oxides such as tin oxide, zinc oxide, indium oxide, indium tin oxide (ITO), and indium zinc oxide; and conductive polymers such as polyaniline, polypyrrole, and polythiophene.

Such electrode substances may be used alone or in combination of two or more thereof. The anode may be constituted by a single layer or a plurality of layers.

When a reflective electrode is provided, it may be formed of, for example, chromium, aluminum, silver, titanium, tungsten, molybdenum, an alloy of the foregoing, or a stacked layer of the foregoing. When a transparent electrode is provided, non-limiting examples thereof include a transparent conductive oxide layer of indium tin oxide (ITO) or indium zinc oxide. Such electrodes can be formed by photolithography.

On the other hand, the cathode can be constituted by a material having a low work function. Examples of the material include alkali metals such as lithium; alkaline-earth metals such as calcium; elemental metals such as aluminum, titanium, manganese, silver, lead, and chromium; mixtures of the foregoing; alloys of combinations of these elemental metals such as magnesium-silver, aluminum-lithium, aluminum-magnesium, silver-copper, and zinc-silver; and metal oxides such as indium tin oxide (ITO). Such electrode substances may be used alone or in combination of two or more thereof. The cathode may be constituted by a single layer or a plurality of layers. In particular, silver is preferably employed; more preferably, in order to suppress aggregation of silver, a silver alloy is employed. As long as aggregation of silver is suppressed, the content ratio in the alloy is not limited, and may be, for example, 1:1.

The cathode is not particularly limited and may be formed as a conductive layer of an oxide such as ITO to provide a top emission device; alternatively, the cathode may be formed as a reflective electrode of, for example, aluminum (Al) to provide a bottom emission device. The method of forming the cathode is not particularly limited; however, for example, direct-current or alternating-current sputtering can be employed because the resultant film has a high coverage, which tends to achieve a reduction in the resistance.

Protective Layer

On the cathode, a protective layer may be disposed. For example, onto the cathode, a glass having a moisture absorbent is bonded, to thereby suppress ingress of, for example, water into the organic compound layers, to thereby suppress occurrence of display failures. In an alternative embodiment, on the cathode, a passivation film formed of, for example, silicon nitride is disposed to suppress ingress of, for example, water into the organic EL layer. For example, after formation of the cathode 7, the resultant article kept in a vacuum is transported into another chamber; CVD is performed to form a silicon nitride film having a thickness of 2 μm as the protective layer. Alternatively, after the film formation by CVD, atomic layer deposition (ALD) may be performed to form a protective layer.

Color Filter

On the protective layer, a color filter may be disposed. For example, a color filter may be formed on another substrate so as to correspond to the size of the organic light emitting device, and bonded to the substrate having the organic light emitting device. Alternatively, on the above-described protective layer, photolithography may be performed to form a patterned color filter. The color filter may be formed of a polymer.

Planarization Layer

A planarization layer may be disposed between the color filter and the protective layer. The planarization layer may be formed of an organic compound that has a low molecular weight or a high molecular weight, preferably a high molecular weight.

Such planarization layers may be disposed so as to overlie and underlie the color filter, and may be formed of the same or different materials. Specific examples of the materials include polyvinylcarbazole resins, polycarbonate resins, polyester resins, ABS resins, acrylic resins, polyimide resins, phenol resins, epoxy resins, silicone resins, and urea resins.

Counter Substrate

On the planarization layer, a counter substrate may be disposed. The counter substrate is disposed at the counter position for the above-described substrate, hence it is referred to as the counter substrate. The material forming the counter substrate may be the same as that of the above-described substrate.

Organic Layers

The organic compound layers (such as a hole injection layer, a hole transport layer, an electron blocking layer, a light emitting layer, a hole blocking layer, an electron transport layer, and an electron injection layer) constituting an organic light emitting device according to an embodiment of the present disclosure are formed by the following method.

The organic compound layers constituting an organic light emitting device according to an embodiment of the present disclosure can be formed by a dry process such as vacuum deposition, ion plating, sputtering, or plasma CVD. Alternatively, instead of the dry process, a wet process may also be employed: the compounds are dissolved in appropriate solvents and applied by a publicly known coating process (such as spin coating, dipping, casting, an LB process, or an ink jet process) to form the layers.

When the layers are formed by, for example, vacuum deposition or a coating process using solutions, the layers tend not to undergo, for example, crystallization and have high stability over time. When the coating process is used to form films, the compounds may be combined with appropriate binder resins for forming the films.

Non-limiting examples of the binder resins include polyvinylcarbazole resins, polycarbonate resins, polyester resins, ABS resins, acrylic resins, polyimide resins, phenol resins, epoxy resins, silicone resins, and urea resins.

Such binder resins may be used alone as a homopolymer or a copolymer, or in combination of two or more thereof. The compounds may be optionally combined with additives such as publicly known plasticizers, antioxidants, and ultraviolet absorbents.

Applications of Organic Light Emitting Device According to Embodiment of Present Disclosure An organic light emitting device according to an embodiment of the present disclosure can be used as a constituent member for a display apparatus or an illumination apparatus, and is also applicable to, for example, the exposure light source of an electrophotographic image-forming apparatus, the backlight of a liquid crystal display apparatus, or a light emitting apparatus in which a white light source is equipped with a color filter.

The display apparatus may be an image information processing apparatus including an image input section configured to input image information from, for example, an area CCD, a linear CCD, or a memory card, and an information processing section configured to process the inputted information, and configured to display the inputted image on a display unit.

An image pickup apparatus or an ink jet printer may have a display unit having a touch panel function. The operation type of this touch panel function is not particularly limited, and may be an infrared type, a capacitance type, a resistive film type, or an electromagnetic induction type. The display apparatus may be used as a display unit of a multifunctional printer.

Hereinafter, the display apparatus according to this embodiment will be described with reference to a drawing. The display apparatus according to this embodiment includes a plurality of pixels, and at least one of the plurality of pixels includes an organic light emitting device according to an embodiment of the present disclosure and a transistor connected to the organic light emitting device.

Figure 3:
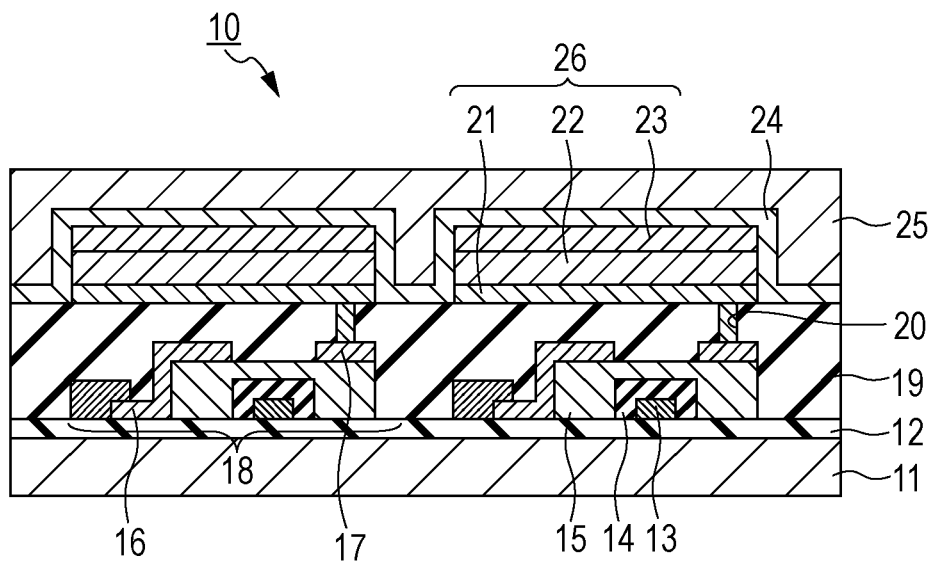
FIG. 3 is a schematic sectional view illustrating an example of a display apparatus including an organic light emitting device according to an embodiment of the present disclosure.

FIG. 3 is a schematic sectional view illustrating an example of a display apparatus including an organic light emitting device and an active element connected to the organic light emitting device. The active element may be a transistor or TFT composed of, for example, polysilicon or oxide semiconductors.

Referring to FIG. 3, a display apparatus 10 includes a substrate 11 formed of, for example, glass, and an insulating layer 12 formed on the substrate 11 to protect the transistor element or organic compound layers. The display apparatus 10 includes, on the insulating layer 12, a transistor element 18 including a gate electrode 13, a gate insulating film 14, a semiconductor layer 15, a drain electrode 16, and a source electrode 17.

The display apparatus includes, on the transistor element, an organic light emitting device 26 with an interlayer insulating layer 19 therebetween. The organic light emitting device 26 includes an anode 21, an organic compound layer 22 including a light emitting layer, and a cathode 23.

In the interlayer insulating layer 19, a contact hole 20 is formed. The anode 21, which constitutes the organic light emitting device, and the source electrode 17 are connected to each other via the contact hole.

Incidentally, the configuration of electric connections of electrodes (anode and cathode) included in the organic light emitting device and electrodes (source electrode and drain electrode) included in the transistor is not limited to the configuration illustrated in FIG. 3. In other words, any configuration may be employed as long as one of the anode and the cathode is electrically connected to one of the source electrode and the drain electrode of the transistor element.

FIG. 3 illustrates, in the display apparatus 10, an organic compound layer 22 like a single layer; however, the organic compound layer 22 may include a plurality of layers. On the cathode 23, a first protective layer 24 and a second protective layer 25 are disposed for suppressing deterioration of the organic light emitting device.

In FIG. 3, the display apparatus 10 employs, as the switching elements, transistors; alternatively, other elements may be employed as the switching elements.

In FIG. 3, in the display apparatus 10, the transistors are not limited to transistors using a single-crystal silicon wafer, and may be thin-film transistors having an active layer on the insulating surface of the substrate. The active layer may be formed of single-crystal silicon, a non-single-crystal silicon such as amorphous silicon or microcrystal silicon, or a non-single-crystal oxide semiconductor such as indium zinc oxide or indium gallium zinc oxide. Incidentally, thin-film transistors are also referred to as TFT elements.

In FIG. 3, the transistors included in the display apparatus 10 may be formed within the substrate such as a Si substrate. The phrase "formed within the substrate" means that the substrate itself such as a Si substrate is processed to form transistors. In other words, the configuration in which transistors are included within the substrate can also be regarded as a configuration in which the substrate and the transistors are formed as a single unit. Whether transistors are formed within the substrate or TFTs are formed depends on the size of the display unit. For example, when the display unit has a size of about 0.5 inches, the organic light emitting device can be formed on a Si substrate.

The organic light emitting device according to this embodiment is controlled, in terms of emission luminance, by transistors as examples of switching elements. A plurality of such organic light emitting devices are arranged in a plane, to emit light rays at individual emission luminances to thereby display images.

Figure 4:
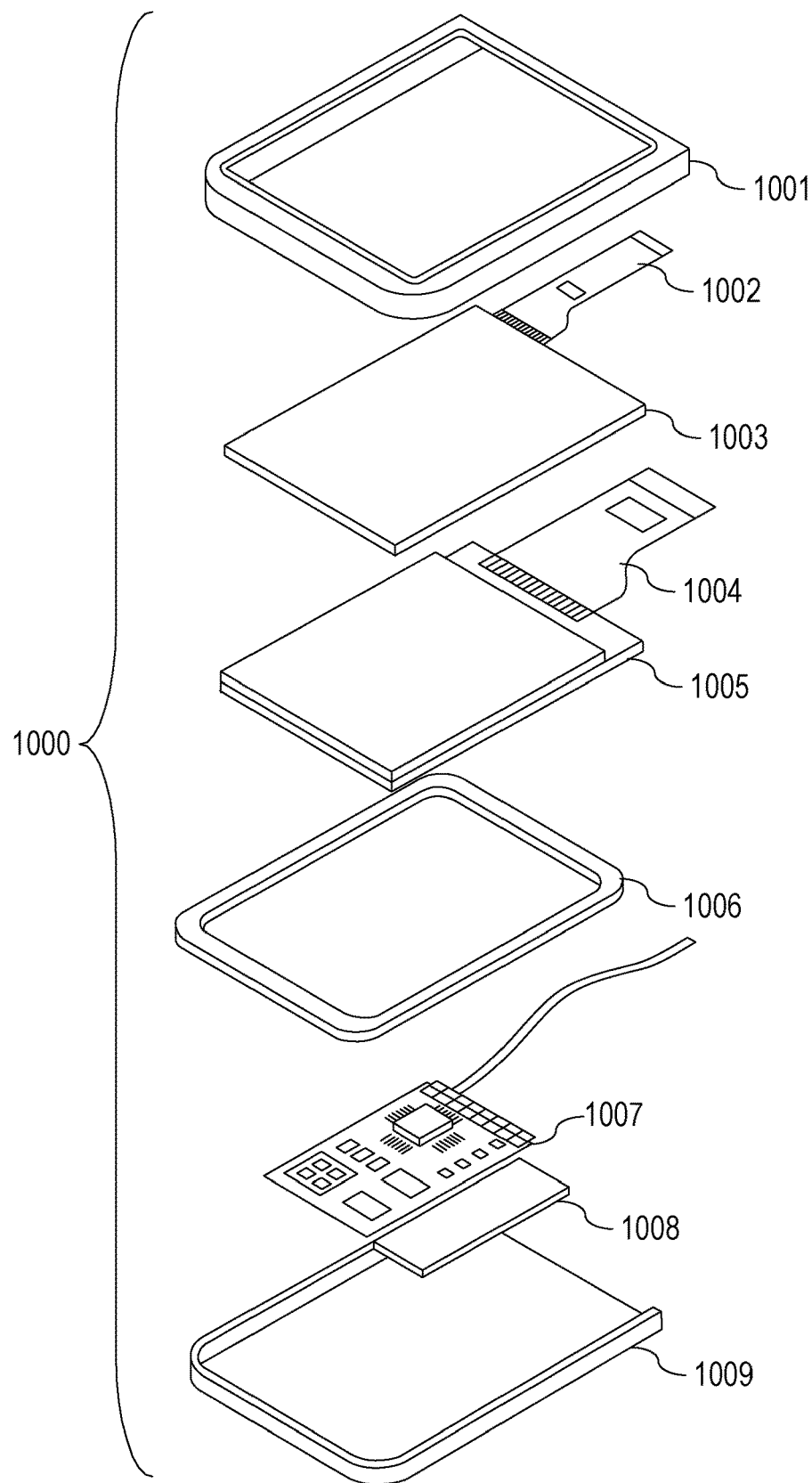
FIG. 4 is a schematic view illustrating an example of a display apparatus according to an embodiment of the present disclosure.

FIG. 4 is a schematic view illustrating an example of a display apparatus according to an embodiment. A display apparatus 1000 may include, between an upper cover 1001 and a lower cover 1009, a touch panel 1003, a display panel 1005, a frame 1006, a circuit substrate 1007, and a battery 1008. To the touch panel 1003 and the display panel 1005, flexible printed circuit FPCs 1002 and 1004 are respectively connected. On the circuit substrate 1007, transistors are formed by printing. The battery 1008 may not be installed when the display apparatus is not a mobile apparatus. When the display apparatus is a mobile apparatus, the battery 1008 may be installed in another position.

A display apparatus according to this embodiment may be used as a display unit of an image pickup apparatus including an optical unit including a plurality of lenses and an image pickup device configured to receive light having passed through the optical unit. The image pickup apparatus may include a display unit configured to display information obtained by the image pickup device. The display unit may be a display unit exposed outside of the image pickup apparatus, or a display unit disposed within the finder. The image pickup apparatus may be a digital camera or a digital video camera. The image pickup apparatus can also be referred to as a photoelectric conversion apparatus.

Figure 5A:
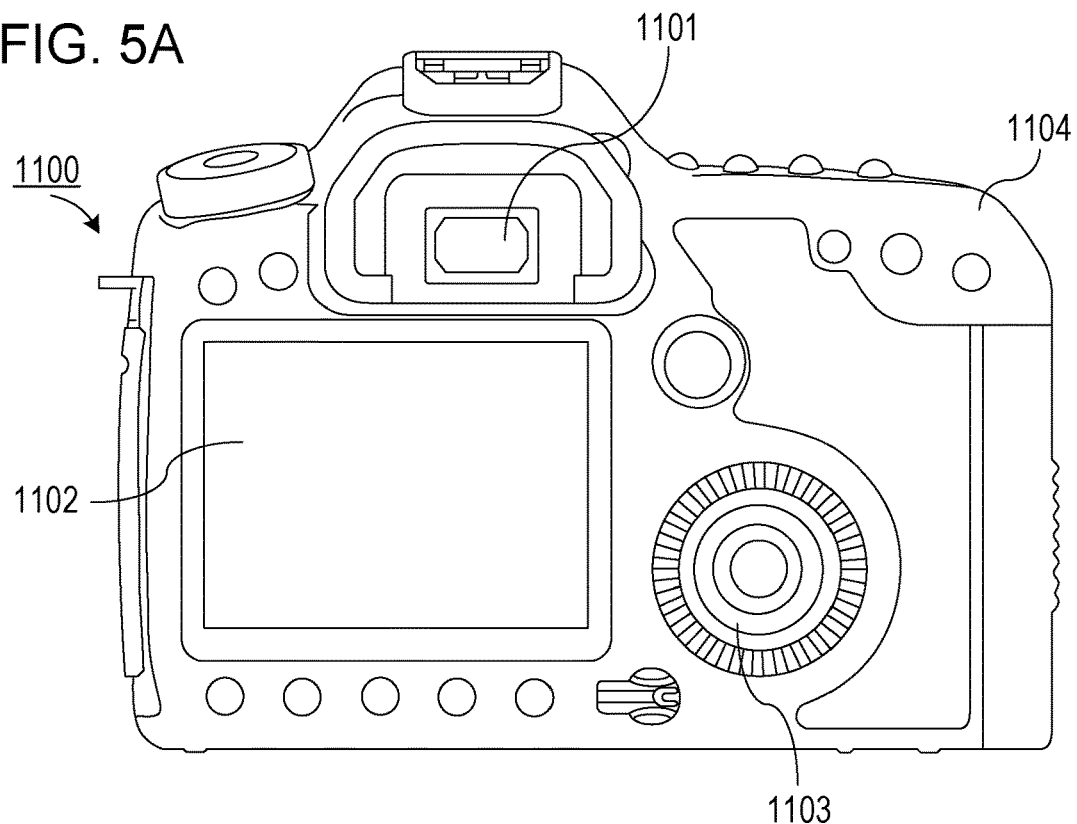
FIG. 5A is a schematic view illustrating an example of an image pickup apparatus according to an embodiment of the present disclosure.

FIG. 5A is a schematic view illustrating an example of an image pickup apparatus according to an embodiment. An image pickup apparatus 1100 may include a view finder 1101, a rear surface display 1102, an operation unit 1103, and a housing 1104. The view finder 1101 may include the display apparatus according to this embodiment. In this case, the display apparatus may display not only an image to be captured, but also, for example, environmental information and image capture instructions. Examples of the environmental information include the intensity of external light, the orientation of external light, the moving speed of the subject, and the probability that the subject may hide behind an obstacle.

Since the timing suitable for capturing an image lasts for a very short period, the information is desirably displayed with minimum delay. Thus, a display apparatus employing an organic light emitting device according to an embodiment of the present disclosure can be used because the organic light emitting device responds at a high speed. The display apparatus employing the organic light emitting device can be more suitably used for such image pickup apparatuses required to display images at high speed than liquid crystal display apparatuses.

The image pickup apparatus 1100 includes an optical unit (not shown). The optical unit includes a plurality of lenses and is configured to form an image in the image pickup device contained within the housing 1104. The plurality of lenses can be adjusted in terms of relative positions, to thereby adjust the focus. This operation can also be performed automatically.

The display apparatus according to this embodiment may include red, green, and blue color filters. These red, green, and blue color filters may be arranged in a delta array.

The display apparatus according to this embodiment may be used for a display unit of a portable terminal. In this case, the display apparatus may have both of a display function and an operation function. Examples of the portable terminal include cellular phones such as smartphones, tablets, and head mount displays.

Figure 5B:
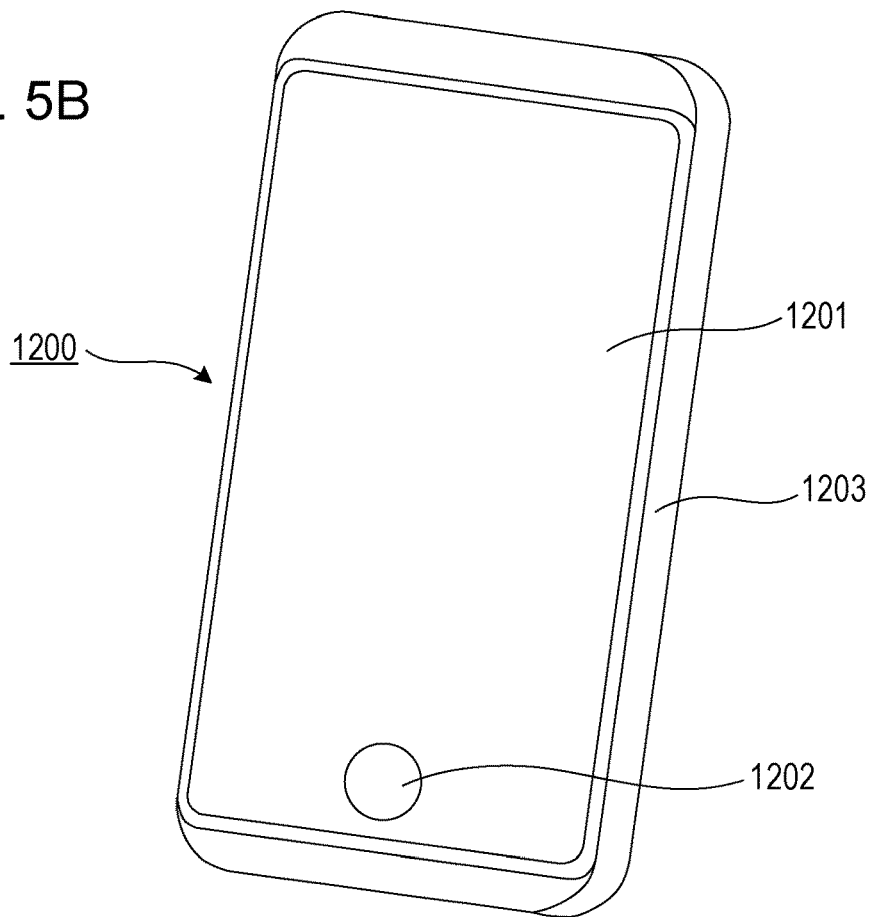
FIG. 5B is a schematic view illustrating an example of an electronic apparatus according to an embodiment of the present disclosure.

FIG. 5B is a schematic view illustrating an example of an electronic apparatus according to an embodiment. An electronic apparatus 1200 includes a display unit 1201, an operation unit 1202, and a housing 1203. The housing 1203 may include circuits, a printed substrate including the circuits, a battery, and a communication unit. The operation unit 1202 may be a button or a touch-panel-type sensor unit. The operation unit may be a biometric unit configured to scan a fingerprint for unlocking, for example. Such an electronic apparatus including a communication unit can also be referred to as a communication apparatus.

Figure 6A:
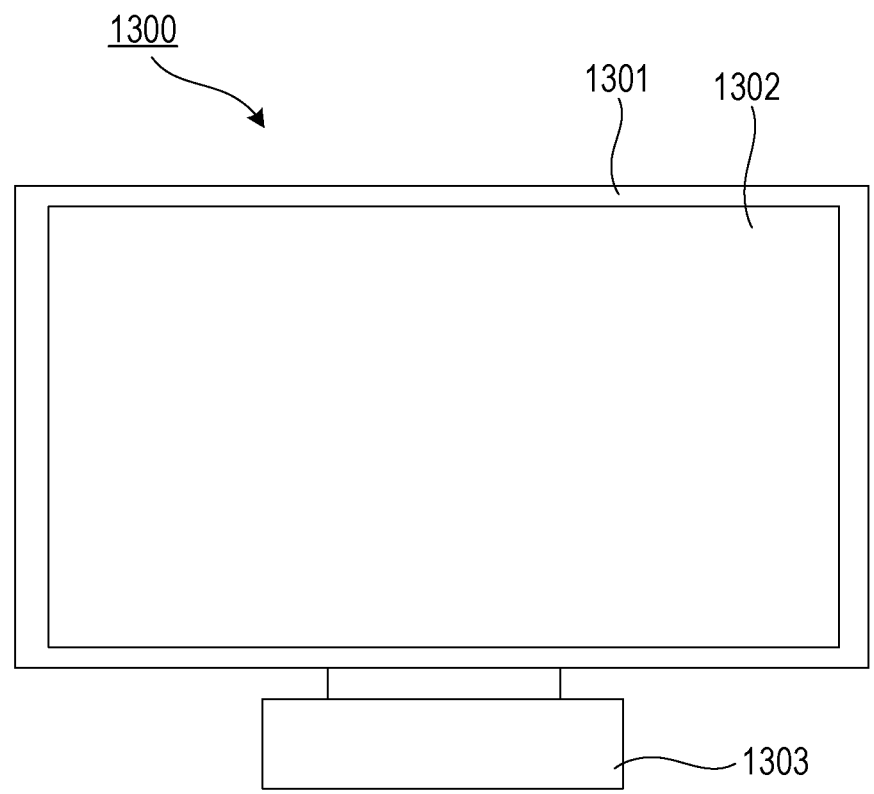
FIG. 6A is a schematic view illustrating an example of a display apparatus according to an embodiment of the present disclosure.
Figure 6B:
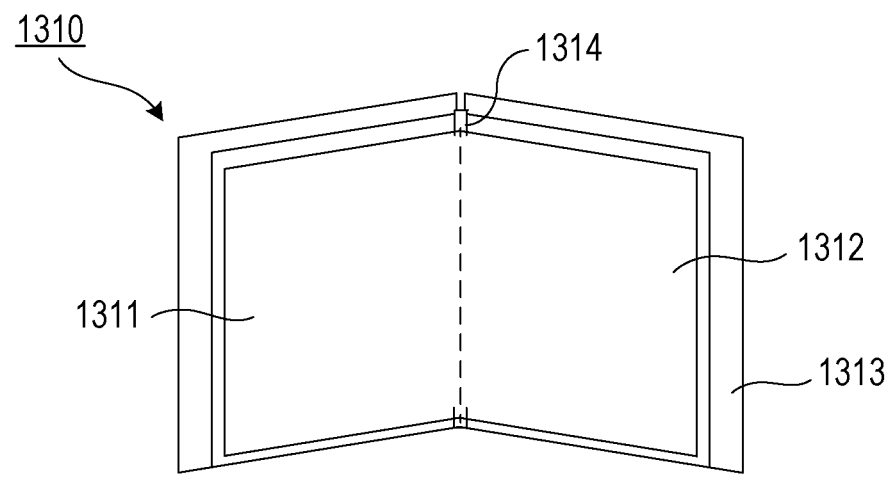
FIG. 6B is a schematic view illustrating an example of a foldable display apparatus.

FIGS. 6A and 6B are schematic views illustrating examples of a display apparatus according to an embodiment. FIG. 6A illustrates a display apparatus such as a television monitor or a PC monitor. A display apparatus 1300 includes a frame 1301 and a display unit 1302. The display unit 1302 may employ the light emitting device according to the embodiment.

The display apparatus includes a base 1303, which supports the frame 1301 and the display unit 1302. The base 1303 is not limited to the form illustrated in FIG. 6A. The lower side of the frame 1301 may also function as the base.

The frame 1301 and the display unit 1302 may be curved. The radius of the curvature may be 5000 mm or more and 6000 mm or less.

FIG. 6B is a schematic view illustrating another example of the display apparatus according to this embodiment. A display apparatus 1310 in FIG. 6B can be folded, namely a foldable display apparatus. The display apparatus 1310 includes a first display unit 1311, a second display unit 1312, a housing 1313, and a folding point 1314. The first display unit 1311 and the second display unit 1312 may include the light emitting device according to the embodiment. The first display unit 1311 and the second display unit 1312 may be collectively designed as a seamless single display apparatus. The first display unit 1311 and the second display unit 1312 can be sectioned with respect to the folding point. Specifically, the first display unit 1311 and the second display unit 1312 may individually display different images; and the first and second display units may collectively display a single image.

Figure 7A:
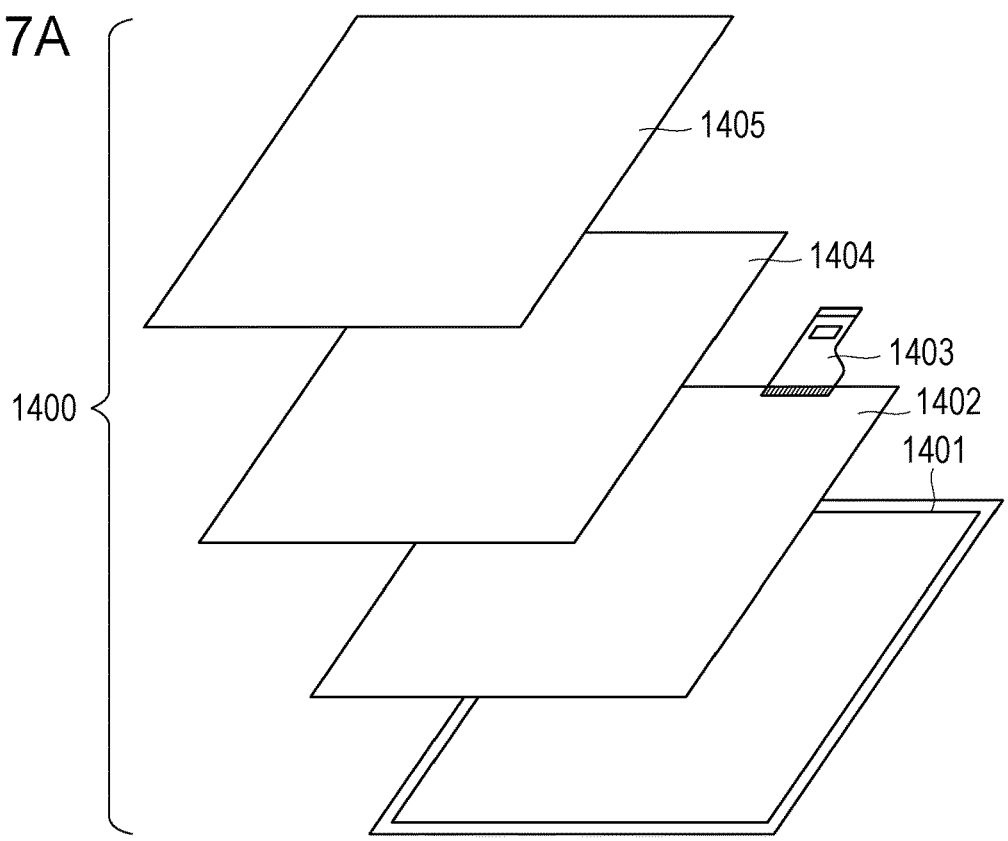
FIG. 7A is a schematic view illustrating an example of an illumination apparatus according to an embodiment of the present disclosure.

FIG. 7A is a schematic view illustrating an example of an illumination apparatus according to an embodiment. An illumination apparatus 1400 may include a housing 1401, a light source 1402, a circuit substrate 1403, an optical film 1404, and a light diffusion unit 1405. The light source may include the organic light emitting device according to the embodiment. An optical filter may be provided to improve color rendering of the light source. The light diffusion unit is configured to effectively diffuse light from the light source to deliver the light to a wide area, such as lighting up. The optical filter and the light diffusion unit may be provided on the light exit side of the illumination. The illumination may be optionally equipped with a cover for the outermost portion thereof.

The illumination apparatus is, for example, an apparatus configured to illuminate the inside of a room. The illumination apparatus may be configured to emit light of any color of white, neutral white, and colors from blue to red. The illumination apparatus may include a light modulation circuit for modulating the light. The illumination apparatus may include an organic light emitting device according to the present disclosure and a power supply circuit connected to the organic light emitting device. The power supply circuit is configured to convert alternating current voltage to direct current voltage. The "white" corresponds to a color temperature of 4200 K. The "neutral white" corresponds to a color temperature of 5000 K. The illumination apparatus may include a color filter.

The illumination apparatus according to this embodiment may include a heat dissipation unit. The heat dissipation unit is configured to release heat inside of the apparatus to the outside of the apparatus. The heat dissipation unit is formed of, for example, a metal having a high specific heat or liquid silicone.

Figure 7B:
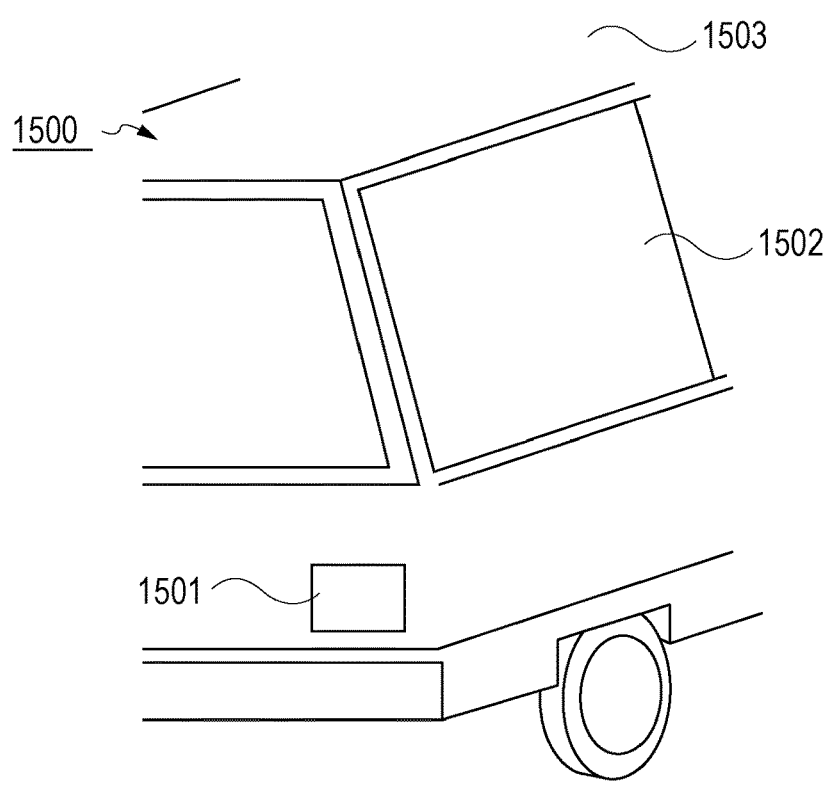
FIG. 7B is a schematic view illustrating an example of an automobile including a vehicle illumination unit according to an embodiment of the present disclosure.

FIG. 7B is a schematic view of an automobile serving as an example of a moving object according to an embodiment. The automobile includes a tail lamp serving as an example of the illumination unit. An automobile 1500 includes a tail lamp 1501 that may be configured to turn on upon braking, for example.

The tail lamp 1501 may include the organic light emitting device according to the embodiment. The tail lamp may include a protective member for protecting the organic light emitting device. The protective member is not limited in terms of material as long as it has relatively high strength and is transparent. The protective member can be formed of polycarbonate, for example. The polycarbonate may be mixed with, for example, a furandicarboxylic acid derivative or an acrylonitrile derivative.

The automobile 1500 may include an automobile body 1503 and a window 1502 attached to the automobile body 1503. When the window is not windows for checking ahead or behind of the automobile, it may be designed as a transparent display. This transparent display may include the organic light emitting device according to the embodiment. In this case, constituent members of the organic light emitting device, such as electrodes, are provided as transparent members.

The moving object according to this embodiment may be a ship, an aircraft, or a drone, for example. The moving object may include a body and an illumination unit provided to the body. The illumination unit may emit light in order to indicate the position of the body. The illumination unit includes the organic light emitting device according to the embodiment.

As has been described so far, apparatuses employing the organic light emitting device according to the embodiment enable displaying of images with high quality for a long time with stability.

EXAMPLES

Example 1

In this Example, an organic light emitting device having a top emission structure was produced in which, on a substrate, an anode, a hole injection layer, a hole transport layer, an electron blocking layer, a first light emitting layer, a second light emitting layer, a first electron transport layer, a second electron transport layer, an electron injection layer, and a cathode were formed in this order.

On a glass substrate, a Ti film having a thickness of 40 nm was formed by sputtering, and patterned by photolithography to form an anode such that the counter electrode (metal electrode layer, cathode) would have an electrode area of 3 mm².

Subsequently, in a vacuum deposition apparatus (manufactured by ULVAC, Inc.), a cleaned substrate having the electrode and materials were attached; the apparatus was evacuated to $1.33 \times 10^{-4}$ Pa ($1 \times 10^{-6}$ Torr), and then UV/ozone cleaning was performed. Subsequently, layers were formed so as to have a layer configuration described in the following Table 1.

TABLE 1

|  |  |  |  | Materials | Film thickness (nm) |
|---|---|---|---|---|---|
| Cathode |  |  |  | Mg:Ag = 1:1 | 10 |
| Electron injection layer |  |  |  | LiF | 1 |
| Second electron transport layer |  |  |  | ET18:ET1 = 50:50 | 30 |
| First electron transport layer |  |  |  | ET18:EMH2 = 50:50 | 70 |
| Light emitting layer 2 | Host A | EMH2 | Weight ratio | EMH2:BD6 = 99.4:0.6 | 10 |
|  | Dopant A | BD6 |  |  |  |
| Light emitting layer 1 | Host B | EMH2 | Weight ratio | EMH2:GD7:RD6 = 96:3.6:0.4 | 10 |
|  | Dopant B | GD7 |  |  |  |
|  | Dopant C | RD6 |  |  |  |
| Electron blocking layer |  |  |  | HT14 | 10 |
| Hole transport layer |  |  |  | HT2 | 10 |
| Hole injection layer |  |  |  | HATCN | 7 |

Subsequently, the substrate was moved into a glove box, and sealed, within a nitrogen atmosphere, using a glass cap including a drying agent, to obtain an organic white-light emitting device.

The obtained organic white-light emitting device was connected to a voltage application device, and evaluated in terms of characteristics. The current-voltage characteristics were measured with a pA meter 4140B manufactured by Hewlett-Packard Company. The emission luminance was measured with a BM7 manufactured by TOPCON CORPORATION.

In addition, a continuous driving test was performed at an initial luminance of 1000 cd/m², and a deterioration ratio of luminance after the lapse of 100 hours was measured. A deterioration ratio of 20% or more was evaluated as "Poor". A deterioration ratio of 10% or more and less than 20% was evaluated as "Fair". A deterioration ratio of 5% or more and less than 10% was evaluated as "Good". A deterioration ratio of less than 5% was evaluated as "Excellent". The results are described in Table 2 below.

Examples 2 to 7 and Comparative Examples 1 to 5

Devices were produced as in Example 1 except that the first electron transport layer, the second electron transport layer, and the light emitting layer Host A were changed to compounds described in the following Table 2. The results of these devices are described in Table 2 together with the results of Example 1.

TABLE 2

| Example Comparative Example | Light emitting layer | First electron transport layer | Second electron transport layer | V@100 mA/cm² | External quantum efficiency EQE | Longevity |
|---|---|---|---|---|---|---|
| Example 1 | Example 1 | ET18:EMH2 50:50 | ET18:ET1 50:50 | 6.8 | 3.5 | Good |
| Example 2 | Same as above | ET18:EMH2 50:50 | ET18:ET1 30:70 | 6.9 | 3.6 | Good |
| Example 3 | Same as above | ET11:EMH3 50:50 | ET11:ET2 50:50 | 6.7 | 3.8 | Excellent |
| Example 4 | Same as above | ET11:EMH3 50:50 | ET11:ET2 30:70 | 6.8 | 3.7 | Excellent |
| Example 5 | Same as above | ET19:EMH8 50:50 | ET19:ET8 50:50 | 6.7 | 3.6 | Good |
| Example 6 | Same as above | ET16:EMH2 50:50 | ET16:ET1 50:50 | 6.9 | 3.8 | Excellent |
| Example 7 | Same as above | ET24:EMH2 50:50 | ET24:ET1 50:50 | 6.5 | 3.4 | Fair |
| Comparative Example 1 | Same as above | ET18 | ET18 | 10.5 | 2.0 | Poor |
| Comparative Example 2 | Same as above | ET1 | ET1 | 7.8 | 2.0 | Poor |
| Comparative Example 3 | Same as above | ET18 | ET1 | 7.6 | 3.5 | Fair |
| Comparative Example 4 | Same as above | ET18:EMH2 50:50 | ET1 | 7.3 | 3.0 | Fair |
| Comparative Example 5 | Same as above | ET18 | ET18:ET1 50:50 | 7.4 | 3.5 | Fair |

Examples 8 to 10 and Comparative Examples 6 to 8

In Example 8, layers were formed to have a layer configuration described in Table 3 below. The results are described in Table 4 together with results of other Examples.

Other devices were produced as in Example 8 except that the first electron transport layer, the second electron transport layer, and the light emitting layer Host A in Example 8 were changed to compounds described in Table 3 below.

The obtained organic blue-light emitting devices were each connected to a voltage application device, and evaluated in terms of characteristics. The current-voltage characteristics were measured with a pA meter 4140B manufactured by Hewlett-Packard Company. The emission luminance was measured with a BM7 manufactured by TOPCON CORPORATION.

In addition, a continuous driving test was performed at an initial luminance of 300 cd/m$^2$, and a deterioration ratio of luminance after the lapse of 100 hours was measured. A deterioration ratio of 20% or more was evaluated as "Poor". A deterioration ratio of 10% or more and less than 20% was evaluated as "Fair". A deterioration ratio of 5% or more and less than 10% was evaluated as "Good". A deterioration ratio of less than 5% was evaluated as "Excellent". The results are described in the following Table 4. Thus, evaluations similar to those of Example 1 were performed. The results are described in Table 4.

TABLE 3

| | Materials | | | Film thickness (nm) |
|---|---|---|---|---|
| Cathode | Mg:Ag = 1:1 | | | 10 |
| Electron injection layer | LiF | | | 1 |
| Second electron transport layer | ET18:ET1 = 50:50 | | | 30 |
| First electron transport layer | ET18:EMH2 = 50:50 | | | 70 |
| Light emitting layer 2 | Host A | EMH2 | Weight ratio EMH2:BD6 = 99.4:0.6 | 20 |
| | Dopant A | BD6 | | |
| Electron blocking layer | HT14 | | | 10 |
| Hole transport layer | HT2 | | | 10 |
| Hole injection layer | HATCN | | | 7 |

TABLE 4

| Example Comparative Example | Light emitting layer | First electron transport layer | Second electron transport layer | V@100 mA/cm$^2$ | External quantum efficiency EQE | Longevity |
|---|---|---|---|---|---|---|
| Example 8 | Example 1 | ET18:EMH2 50:50 | ET18:ET1 50:50 | 6.2 | 4.6 | Good |
| Example 9 | Same as above | ET18:EMH2 50:50 | ET18:ET1 30:70 | 6.3 | 4.5 | Good |
| Example 10 | Same as above | ET11:EMH3 50:50 | ET11:ET2 50:50 | 6.2 | 4.8 | Excellent |
| Comparative Example 6 | Same as above | ET18 | ET18 | 8.5 | 3.5 | Poor |
| Comparative Example 7 | Same as above | ET1 | ET1 | 7.1 | 3.6 | Poor |
| Comparative Example 8 | Same as above | ET18 | ET1 | 7.3 | 3.6 | Fair |

Example 11

Evaluation of HOMO Energy

The hosts and dopants were evaluated in the following manner.

On aluminum substrates, thin films having a thickness of 30 nm and composed of measurement target compounds were formed. These thin films were measured with an AC-3 (manufactured by Riken Keiki Co., Ltd.). The results are described in Table 5.

TABLE 5

| Material No. | HOMO energy (eV) |
|---|---|
| ET1 | 6.1 |
| ET2 | 6.1 |
| ET8 | 6.0 |
| ET11 | 6.0 |
| ET16 | 6.0 |
| ET18 | 6.2 |
| ET19 | 6.2 |
| ET24 | 6.1 |
| EMH2 | 5.9 |
| EMH3 | 5.9 |
| EMH8 | 5.9 |
| BD6 | 6.1 |
| GD7 | 5.9 |
| RD6 | 5.6 |

As is clear from Examples, organic light emitting devices according to the present disclosure in which the first electron transport layer and the second electron transport layer are mixture layers have been found to emit light at high efficiencies and at low voltages. By contrast, as is clear from Comparative Examples, devices in which at least one of the electron transport layers is not a mixture layer have been found to emit light at increased voltages. In addition, compared with a device in which the first electron transport layer includes a nitrogen-containing aromatic compound, devices in which the first electron transport layer is composed of hydrocarbons and not including nitrogen-containing aromatic compounds have been found to have long longevity.

In addition, devices satisfying the following relation:

HOMO energy: (Host material A)<(Electron transport material A)<(Electron transport material B), have been found to have particularly good results in terms of longevity and efficiency.

The present disclosure can provide an organic light emitting device having a reduced drive voltage.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-087712, filed May 7, 2019, which is hereby incorporated by reference herein in its entirety.

What is claimed is:

1. An organic light emitting device comprising, in sequence, an anode, a light emitting layer, a first electron transport layer, a second electron transport layer, and a cathode,
   wherein the second electron transport layer includes a first material and a second material different from the first material, and the first electron transport layer includes a third material and a fourth material different from the third material,
   wherein the first material, the second material, the third material, and the fourth material satisfy the following conditions (a) and (b):
   (a) |HOMO (first material)|>|HOMO (second material)|>|HOMO (fourth material)|
   (b) |HOMO (first material)|>|HOMO (third material)|>|HOMO (fourth material)|
   where HOMO (first material), HOMO (second material), HOMO (third material), and HOMO (fourth material) represent a value of highest occupied molecular orbital (HOMO) energy of the first material, a value of HOMO energy of the second material, a value of HOMO energy of the third material, and a value of HOMO energy of the fourth material, respectively.

2. The organic light emitting device according to claim 1, wherein the light emitting layer and the first electron transport layer are disposed in contact with each other, the first electron transport layer and the second electron transport layer are disposed in contact with each other, the light emitting layer includes a fifth material,
   the second material and the third material are the same compound, and the fourth material and the fifth material are the same compound.

3. The organic light emitting device according to claim 2, wherein the fifth material is a hydrocarbon compound.

4. The organic light emitting device according to claim 2, wherein the light emitting layer further includes a sixth material, and
   relative to 100 wt % of a weight of the light emitting layer, the fifth material has a larger weight percentage than the sixth material in the light emitting layer.

5. The organic light emitting device according to claim 4, wherein the sixth material is a light emitting material.

6. The organic light emitting device according to claim 1, wherein at least one of the third material and the fourth material is an organic compound.

7. The organic light emitting device according to claim 1, wherein the second material is a hydrocarbon compound.

8. The organic light emitting device according to claim 1, wherein the first material is a heterocyclic compound.

9. The organic light emitting device according to claim 8, wherein the heterocyclic compound is a compound including a nitrogen atom as a heteroatom.

10. The organic light emitting device according to claim 1, wherein the second material includes an aryl group, the aryl group optionally having, as a substituent, an alkyl group having 1 to 12 carbon atoms, and the aryl group is selected from the group consisting of benzene, naphthalene, fluorene, benzofluorene, phenanthrene, chrysene, triphenylene, pyrene, fluoranthene, and benzofluoranthene.

11. The organic light emitting device according to claim 1, wherein the light emitting layer includes a fifth material, and satisfies a relation:
   Absolute value of HOMO energy of the fifth material<Absolute value of HOMO energy of the second material.

12. The organic light emitting device according to claim 1, wherein the anode is an electrode configured to reflect light, and the cathode is an electrode configured to transmit light.

13. The organic light emitting device according to claim 1, wherein the light emitting layer includes at least two layers.

14. A display apparatus comprising a plurality of pixels,
   wherein at least one of the plurality of pixels includes the organic light emitting device according to claim 1, and a transistor connected to the organic light emitting device.

15. A photoelectric conversion apparatus comprising:
   an optical unit including a plurality of lenses;
   an image pickup device configured to receive light having passed through the optical unit; and
   a display unit configured to display an image captured with the image pickup device, wherein the display unit includes the organic light emitting device according to claim 1.

16. An electronic apparatus comprising:
   a display unit including the organic light emitting device according to claim 1;
   a housing provided with the display unit; and
   a communication unit provided in the housing, and configured to communicate with an external device.

17. An illumination apparatus comprising:
   a light source including the organic light emitting device according to claim 1; and
   a light diffusion unit or an optical film configured to transmit light emitted from the light source.

18. A moving object comprising:
   an illumination unit including the organic light emitting device according to claim 1; and
   a body provided with the illumination unit.

19. The organic light emitting device according to claim 1, wherein the second material and the third material are the same compound.

20. The organic light emitting device according to claim 1, wherein the first electron transport layer and the second electron transport layer are disposed in contact with each other.

21. The organic light emitting device according to claim 1, wherein the light emitting layer includes a fifth material, and
   the fourth material and the fifth material are the same compound.

22. The organic light emitting device according to claim 1, wherein the light emitting layer and the first electron transport layer are disposed in contact with each other.

23. The organic light emitting device according to claim 1, wherein the third material, and the fourth material satisfy the following condition (c):
   (c) |LUMO (third material)|>|LUMO (fourth material)|
   where LUMO (third material), and LUMO (fourth material) represent a value of lowest unoccupied molecular orbital (LUMO) energy of the third material, and a value of LUMO energy of the fourth material, respectively.

24. The organic light emitting device according to claim 1, wherein the first material, and the second material satisfy the following condition (d):

(c) |LUMO (first material)|>|LUMO (second material)|
where LUMO (first material), and LUMO (second material) represent a value of LUMO energy of the first material, and a value of LUMO energy of the second material, respectively.

25. An electrophotographic image-forming apparatus, comprising an exposure light source including the organic light emitting device according to claim 1.

* * * * *